(12) United States Patent
Sohn et al.

(10) Patent No.: US 9,505,606 B2
(45) Date of Patent: Nov. 29, 2016

(54) MEMS ACTUATOR WITH DISCRETELY CONTROLLED MULTIPLE MOTIONS

(75) Inventors: Jin Young Sohn, Fullerton, CA (US); Gyoung Il Cho, Seoul (KR); Cheong Soo Seo, Seongnam (KR)

(73) Assignees: Angstrom, Inc., Seongnam (KR); Stereo Display, Inc., Anaheim, CA (US)

( * ) Notice: Subject to any disclaimer, the term of this patent is extended or adjusted under 35 U.S.C. 154(b) by 568 days.

(21) Appl. No.: 11/762,683

(22) Filed: Jun. 13, 2007

(65) Prior Publication Data

US 2008/0309190 A1    Dec. 18, 2008

(51) Int. Cl.
*H02N 1/00* (2006.01)
*G02B 26/08* (2006.01)
*B81B 3/00* (2006.01)

(52) U.S. Cl.
CPC ................... *B81B 3/0062* (2013.01)

(58) Field of Classification Search
USPC ............ 310/309; 359/223.1–226.2, 290, 291
See application file for complete search history.

(56) References Cited

U.S. PATENT DOCUMENTS

| | | |
|---|---|---|
| 2,002,376 A | 5/1935 | Mannheimer |
| 4,407,567 A | 10/1983 | Michelet |
| 4,834,512 A | 5/1989 | Austin |
| 4,853,787 A | 8/1989 | Kurth |
| 4,944,580 A | 7/1990 | MacDonald |
| 5,004,319 A | 4/1991 | Smither |
| 5,172,235 A | 12/1992 | Wilm |
| 5,212,555 A | 5/1993 | Stoltz |
| 5,369,433 A | 11/1994 | Baldwin |
| 5,402,407 A | 3/1995 | Eguchi |
| 5,467,121 A | 11/1995 | Allcock |
| 5,510,824 A * | 4/1996 | Nelson ..................... 347/239 |
| 5,612,736 A | 3/1997 | Vogeley |
| 5,661,518 A | 8/1997 | Palm |
| 5,696,619 A | 12/1997 | Knipe |
| 5,748,199 A | 5/1998 | Palm |
| 5,881,034 A | 3/1999 | Mano |
| 5,897,195 A | 4/1999 | Choate |
| 5,986,811 A | 11/1999 | Wohlstadter |
| 6,025,951 A | 2/2000 | Swart et al. |
| 6,028,689 A | 2/2000 | Michalicek |
| 6,064,423 A | 5/2000 | Geng |
| 6,084,843 A | 7/2000 | Abe |
| 6,104,425 A | 8/2000 | Kanno |
| 6,111,900 A | 8/2000 | Suzudo |
| 6,123,985 A | 9/2000 | Robinson |
| 6,233,087 B1 | 5/2001 | Hawkins |
| 6,271,955 B1 * | 8/2001 | Atobe et al. ................. 359/291 |
| 6,282,213 B1 | 8/2001 | Gutin |
| 6,304,263 B1 | 10/2001 | Chiabrera |
| 6,315,423 B1 | 11/2001 | Yu |
| 6,329,737 B1 | 12/2001 | Jerman |
| 6,329,963 B1 | 12/2001 | Chiabrera |
| 6,421,081 B1 | 7/2002 | Markus |
| 6,438,272 B1 | 8/2002 | Huang |
| 6,498,673 B1 | 12/2002 | Frigo |
| 6,507,366 B1 | 1/2003 | Lee |

(Continued)

*Primary Examiner* — Karl I Tamai

(57) ABSTRACT

A MEMS (micro electro mechanical system) actuator with discretely controlled multiple motions comprises bottom layer, stepper plate, support, and motion plate. The multiple motion of the motion plate is generated by the electrostatically actuated stepper plates and geometrically predetermined supports. By introducing the MEMS actuator with discretely controlled multiple motions, simple motion control can be achieved by digital controlling and only single voltage is needed for motion control of the motion plate.

23 Claims, 16 Drawing Sheets

(56) References Cited

U.S. PATENT DOCUMENTS

| | | |
|---|---|---|
| 6,549,730 B1 | 4/2003 | Hamada |
| 6,600,591 B2 | 7/2003 | Anderson |
| 6,611,343 B1 | 8/2003 | Frankowski |
| 6,618,209 B2 | 9/2003 | Nishioka |
| 6,625,342 B2 | 9/2003 | Staple |
| 6,649,852 B2 | 11/2003 | Chason |
| 6,650,461 B2 | 11/2003 | Atobe |
| 6,658,208 B2 | 12/2003 | Watanabe |
| 6,711,319 B2 | 3/2004 | Hoen |
| 6,738,177 B1 * | 5/2004 | Gutierrez et al. ............ 359/298 |
| 6,741,384 B1 | 5/2004 | Martin |
| 6,781,731 B2 | 8/2004 | Choi |
| 6,781,732 B2 | 8/2004 | Cho |
| 6,784,771 B1 | 8/2004 | Fan |
| 6,801,260 B1 | 10/2004 | Veksland |
| 6,804,429 B2 | 10/2004 | Yu |
| 6,833,938 B2 | 12/2004 | Nishioka |
| 6,836,459 B2 | 12/2004 | Komoto |
| 6,870,660 B2 | 3/2005 | DiCarlo |
| 6,885,819 B2 | 4/2005 | Shinohara |
| 6,900,901 B2 | 5/2005 | Harada |
| 6,900,922 B2 | 5/2005 | Aubuchon |
| 6,906,848 B2 | 6/2005 | Aubuchon |
| 6,906,849 B1 | 6/2005 | Mi |
| 6,909,453 B2 | 6/2005 | Mochizuki |
| 6,914,712 B2 | 7/2005 | Kurosawa |
| 6,919,982 B2 | 7/2005 | Nimura |
| 6,934,072 B1 | 8/2005 | Kim |
| 6,934,073 B1 | 8/2005 | Kim |
| 6,943,950 B2 | 9/2005 | Lee |
| 6,944,103 B2 | 9/2005 | Hong |
| 6,956,687 B2 | 10/2005 | Moon |
| 6,958,777 B1 | 10/2005 | Pine |
| 6,970,284 B1 | 11/2005 | Kim |
| 6,971,116 B2 | 11/2005 | Takeda |
| 6,985,299 B2 | 1/2006 | Bakin |
| 6,995,897 B2 | 2/2006 | Mushika |
| 6,995,909 B1 | 2/2006 | Hayashi |
| 6,999,226 B2 | 2/2006 | Kim |
| 7,009,561 B2 | 3/2006 | Menache |
| 7,019,376 B2 | 3/2006 | Patel |
| 7,023,466 B2 | 4/2006 | Favalora |
| 7,025,461 B2 | 4/2006 | Veligdan |
| 7,027,207 B2 | 4/2006 | Huibers |
| 7,031,046 B2 | 4/2006 | Kim |
| 7,046,447 B2 | 5/2006 | Raber |
| 7,057,826 B2 | 6/2006 | Cho |
| 7,068,415 B2 | 6/2006 | Mushika |
| 7,068,416 B2 | 6/2006 | Gim |
| 7,077,523 B2 | 7/2006 | Seo |
| 7,079,325 B2 | 7/2006 | Konno |
| 7,088,493 B2 | 8/2006 | Alain |
| 7,091,057 B2 | 8/2006 | Gan |
| 7,127,136 B2 | 10/2006 | Hall |
| 7,161,729 B2 | 1/2007 | Kim |
| 7,164,465 B2 | 1/2007 | Klosner |
| 7,173,653 B2 | 2/2007 | Gim |
| 7,184,192 B2 | 2/2007 | Sandstrom |
| 7,195,163 B2 | 3/2007 | Yoo |
| 7,209,286 B2 | 4/2007 | Mann |
| 7,212,330 B2 | 5/2007 | Seo |
| 7,215,882 B2 | 5/2007 | Cho |
| 7,239,438 B2 | 7/2007 | Cho |
| 7,245,325 B2 | 7/2007 | Yamaguchi |
| 7,245,363 B2 | 7/2007 | Mushika |
| 7,261,417 B2 | 8/2007 | Cho |
| 7,267,447 B2 | 9/2007 | Kim |
| 7,274,517 B2 | 9/2007 | Cho |
| 7,306,344 B2 | 12/2007 | Abu-Ageel |
| 7,315,503 B2 | 1/2008 | Cho |
| 7,333,260 B2 | 2/2008 | Cho |
| 7,339,746 B2 | 3/2008 | Kim |
| 7,354,167 B2 | 4/2008 | Cho |
| 7,355,627 B2 | 4/2008 | Yamazaki |
| 7,370,412 B2 | 5/2008 | Hiraoka |
| 2003/0174234 A1 | 9/2003 | Kondo |
| 2004/0021802 A1 | 2/2004 | Yoshino |
| 2004/0061917 A1 * | 4/2004 | Mushika et al. ............. 359/223 |
| 2004/0184146 A1 | 9/2004 | Uehara |
| 2004/0207768 A1 | 10/2004 | Liu |
| 2005/0206773 A1 | 9/2005 | Kim |
| 2005/0207486 A1 | 9/2005 | Lee |
| 2005/0212856 A1 | 9/2005 | Temple |
| 2005/0259158 A1 | 11/2005 | Jacob |
| 2006/0007301 A1 | 1/2006 | Cho |
| 2006/0120706 A1 | 6/2006 | Cho |
| 2006/0146140 A1 | 7/2006 | Kennedy |
| 2006/0209439 A1 | 9/2006 | Cho |
| 2006/0256332 A1 | 11/2006 | Sandstrom |
| 2007/0263113 A1 | 11/2007 | Baek |
| 2008/0309190 A1 * | 12/2008 | Sohn et al. ................... 310/309 |

\* cited by examiner

MEMS ACTUATOR WITH DISCRETELY CONTROLLED MULTIPLE MOTIONS

FIELD OF INVENTION

The present invention relates to micro-electro mechanical systems in general and more specifically motion control and generation for micro-electro mechanical systems (MEMS).

BACKGROUND OF THE INVENTION

Motion plates may be used in various optical applications instead of, or in addition to, conventional optoelectronic devices. It is desirable to have capability to move the motion plates by rotation and translation with very fine control.

Since the micro-electro mechanical systems (MEMS) were developed, many applications in MEMS have been developed and used. Micro actuator is the main part of the research and applications in MEMS field. Devices and application using MEMS actuators are developed and used in various fields such as optical communication, display, motion sensor, and medical devices. As the applications of MEMS actuators grow rapidly, the demand on controlling motion plate device increases. It is desirable to have the motion control of the MEMS actuator with many degrees of freedom and simple driving method. Usually, electrostatic, magnetic, piezo, and thermal actuations are widely used in the MEMS industry.

A translational motion only MEMS actuator has been used for phase-only piston-style motion and deformable mirrors. These applications are mainly used for phase adaptive optics applications. A rotational motion of MEMS actuator is also developed for light modulation and MEMS device movements. Most of these motion plates have been controlled to have continuous displacements, which are determined at the equilibrium between electrostatic force and elastic force.

As an example, U.S. Pat. No. 7,036,312 is a good example of thermally controlled MEMS actuator device. Two cantilever actuator by thermally controlled make motion of actuation. Also U.S. Pat. No. 6,914,710 shows an example of electrostatic comb actuators. Comb actuator is one of the most widely used electrostatic actuators. Capacitive force of two different plates with different voltages makes strong attraction force. The electro capacitive force is a source of the force of the electrostatic MEMS actuator. Also, U.S. Pat. No. 6,858,911 shows an example of electromagnetic MEMS actuator. The electromagnetic MEMS actuator comprises a magnetic material, and an electrically conductive coil about the magnetic coil. The coil and the magnetic core can be arranged to generate a magnetic field to move the actuation element. But these actuators have a complicated driving mechanism and control method.

Therefore, the demand on the simple control of the MEMS actuator with higher degrees of freedom and precision has been increased in MEMS industry. The present invention is intended to provide a MEMS actuator device with multiple motions, variable degrees of freedom, low driving voltage, and simple activation mechanism. The MEMS actuator of the present invention can have one degree of freedom rotational motion, one degree of freedom translational motion, one degree of freedom rotational and one degree of freedom translational motion, two degrees of freedom rotational motion, and two degrees of freedom rotational motion and one degree of freedom translational motion, depending on its system configuration.

SUMMARY OF THE INVENTION

The present invention addresses the problems of the prior art and provides a MEMS actuator with discretely controlled multiple motions having the fine and simple control of rotation and translation.

The MEMS (micro electro mechanical system) actuator with discretely controlled multiple motions of the present invention comprises a bottom layer having control circuitry, at least one stepper plate, at least one support, wherein each support is geometrically coupled to the corresponding stepper plate to define motion, and a motion plate having pre-determined multiple motions supported by the stepper plates and the supports.

The motions of the motion plate are pre-programmed by the supports and the stepper plates and each of the pre-programmed motions of the motion plate is provided by actuating a predetermined set of stepper plates.

Each support in the present invention is geometrically coupled to the corresponding stepper plate to define motion and the motion plate has pre-determined multiple motions supported by the stepper plates and the supports;

The control circuitry of the present invention is coupled with the stepper plate electrodes and selectively activates the stepper plate electrodes. The control circuitry is wire structure directly connected with the stepper plate electrodes to supply voltages. By selectively applying voltages to the stepper plate electrodes through the wire structures, the motion of the motion plate can be discretely controlled.

The control circuitry can be an electrical addressing circuitry. Also the electrical addressing circuitry comprises a plurality of memory type cell forming a memory addressing array. The memory addressing array comprises SRAM circuits to activate the stepper plate electrodes. The memory addressing array comprises DRAM circuits to activate the stepper plate electrodes.

The control circuitry comprises a MOS-type or CMOS-type circuitry on the bottom layer. By controlling the MOS-type or CMOS-type circuitry on the bottom layer, the stepper plate electrodes can be selectively activated thus the motion of the motion plate can have multiple motions.

By proper configuration of the control circuitry, the control circuitry can be operated by digital voltage. Thus the motion of the motion plate can be controlled by the digital voltage.

The control circuitry supplies discrete control voltage to the stepper plate electrodes. The discretely controlled voltage to the stepper plate electrodes can control the motion of the motion plate.

Each stepper plate is configured to have pre-programmed rotations about multiple axes by activating predetermined sets of the stepper plate electrodes and each support is configured to define a motion of the motion plate when the stepper plate is actuated.

The support is a motion plate bottom support located under the motion plate and each of the motion plate bottom supports is geometrically coupled to the stepper plate and one end is disposed on the bottom side of the motion plate and the other end is configured to contact the stepper plate when the stepper plate is actuated.

The motion of the motion plate is defined by the contact points of the motion plate bottom support and the stepper plate top side. The support is a stepper plate top support located on the stepper plate. Each of the stepper plate top supports is geometrically coupled to the motion plate and one end is disposed on the top side of the stepper plate and the other end is configured to contact the motion plate bottom side when the stepper plate is actuated. The motion of the motion plate is defined by the contact points of the stepper plate top support and the motion plate bottom side.

The support is a stepper plate bottom support located under the stepper plate and each of the stepper plate bottom supports is geometrically coupled to the bottom layer and one end is disposed on the bottom side of the stepper plate and the other end is configured to contact the bottom layer when the stepper plate is actuated.

The inclination angle of the stepper plate is defined the contact points of the stepper plate bottom support and the bottom layer. The motion of the motion plate is defined by the contact points of the stepper plate and the motion plate and the inclination angle of the stepper plate. The contact points of the stepper plate and the motion plate are determined by the stepper plate top support. The contact points of the stepper plate and the motion plate are determined by the motion plate bottom support.

The support is a bottom layer support located on the bottom layer. Each of the bottom layer supports is geometrically coupled to the stepper plate and one end is disposed on the top side of the bottom layer and the other end is configured to contact the bottom side of the stepper plate when the stepper plate is actuated. The inclination angle of the stepper plate is defined the contact points of the bottom layer support and the stepper plate.

The motion of the motion plate is defined by the contact points of the stepper plate and the motion plate and the inclination angle of the stepper plate. The contact points of the stepper plate and the motion plate are determined by the stepper plate top support. The contact points of the stepper plate and the motion plate are determined by the motion plate bottom support.

The support is a stepper plate inner support and the stepper plate inner support is disposed on the bottom layer and is configured to contact the bottom side of the stepper plate when the stepper plate is actuated. The inclination angle of the stepper plate is defined the contact points of the stepper plate and the stepper plate inner support.

The motion of the motion plate is defined by the contact points of the stepper plate and the motion plate and the inclination angle of the stepper plate. The rotation of the stepper plate is pre-programmed by position of the stepper plate inner support. The rotation of the stepper plate is pre-programmed by height of the stepper plate inner support, wherein the stepper plate inner support has variation in height.

The stepper plate has at least one stepper plate tip, configured to contact the bottom layer including landing structures for reducing the contact area of the actuated stepper plate with the bottom layer.

The motion of the motion plate is defined by the height of the support.

The motion plate can further comprise at least one motion plate electrode, disposed on the bottom layer, configured to pull the motion plate down toward the bottom layer to make contact between the motion plate and the actuated stepper plate. The stepper plate is actuated by electrostatic force induced by the stepper plate electrodes.

The driving voltage of the motion plate is reduced by using multiple stepper plate electrodes to actuate the stepper plate.

Each stepper plate has at least one landing structure, disposed on the bottom layer, configured to stop the rotation of the stepper plate by contacting the actuated stepper plate.

The motion plate can have various degrees of freedom motions. The motion plate has one rotational degree of freedom motion. The motion plate has two rotational degrees of freedom motion. The motion plate has two translational degrees of freedom motion. The motion plate has one rotational degree of freedom motion and one translational degree of freedom motion. The motion plate has two rotational degrees of freedom motion and one translational degree of freedom motion.

While the MEMS actuator with discretely controlled multiple motions of the present invention combined as an array, the array of the MEMS actuator with discretely controlled multiple motions comprises the motion plates with various degrees of freedom rotation or translation which are controlled independently. In order to do this, each motion plate must have capability to control object on the motion plate to a desired direction by controls of respective degrees of freedom rotation or translation.

This MEMS actuator with discretely controlled multiple motions can be applied to the motion control of the micromirror device. The general principle, structure and methods for making the discrete motion control of MEMS device including micromirrors are disclosed in U.S. patent application Ser. No. 10/872,241 filed Jun. 18, 2004, U.S. patent application Ser. No. 11/072,597 filed Mar. 4, 2005, U.S. patent application Ser. No. 11/347,590 filed Feb. 4, 2006, U.S. patent application Ser. No. 11/369,797 filed Mar. 6, 2006, U.S. patent application Ser. No. 11/426,565 filed Jun. 26, 2006, U.S. patent application Ser. No. 11/463,875 filed Aug. 10, 2006, U.S. patent application Ser. No. 11/534,613 filed Sep. 22, 2006, U.S. patent application Ser. No. 11/534,620 filed Sep. 22, 2006, U.S. patent application Ser. No. 11/549,954 filed Oct. 16, 2006, U.S. patent application Ser. No. 11/609,882 filed Dec. 12, 2006, U.S. patent application Ser. No. 11/685,119 filed Mar. 12, 2007, U.S. patent application Ser. No. 11/693,698 filed Mar. 29, 2007, and U.S. patent application Ser. No. 11/742,510 filed Apr. 30, 2007, all of which are incorporated herein by references.

While used as an array with micromirrors, the motion of the micromirrors can be controlled independently and the micromirror array can be built as an optical device such as a spatial light modulator and a Micromirror Array Lens. The general principle and methods for making the Micromirror Array Lens are disclosed in U.S. Pat. No. 6,970,284 issued Nov. 29, 2005 to Kim, U.S. Pat. No. 7,031,046 issued Apr. 18, 2006 to Kim, U.S. Pat. No. 6,934,072 issued Aug. 23, 2005 to Kim, U.S. Pat. No. 6,934,073 issued Aug. 23, 2005 to Kim, U.S. Pat. No. 7,161,729 issued Jan. 9, 2007, U.S. Pat. No. 6,999,226 issued Feb. 14, 2006 to Kim, U.S. Pat. No. 7,095,548 issued Aug. 22, 2006 to Cho, U.S. patent application Ser. No. 10/893,039 filed Jul. 16, 2004, U.S. patent application Ser. No. 10/983,353 filed Nov. 8, 2004, U.S. patent application Ser. No. 11/076,616 filed Mar. 10, 2005, U.S. patent application Ser. No. 11/426,565 filed Jun. 26, 2006, and U.S. patent application Ser. No. 11/743,664 filed May 2, 2007, all of which are incorporated herein by references.

The MEMS actuator with discretely controlled multiple motions of the present invention has advantages including: (1) the MEMS actuator provides multiple motions; (2) the MEMS actuator can be controlled in a low driving voltage; (3) simple motion control is achieved by applying digital control; (4) the MEMS actuator has a fine motion control of the motion plate using multiple supports and electrodes; (5)

only single voltage is needed for driving the control circuitry; and (6) the motion plate is controlled discretely.

Although the present invention is briefly summarized, the full understanding of the invention can be obtained by the following drawings, detailed description, and appended claims.

DESCRIPTION OF THE FIGURES

These and other features, aspects and advantages of the present invention will become better understood with reference to the accompanying drawings, wherein.

DETAILED DESCRIPTION OF THE INVENTION

Figure 1A:
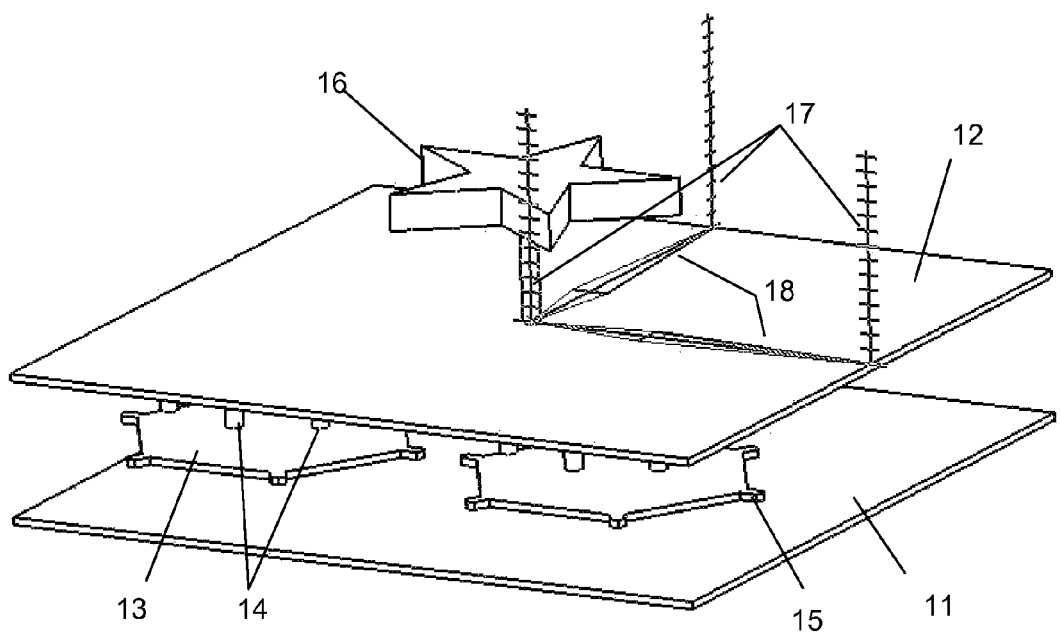
FIG. 1a-1c shows schematic diagram of the MEMS actuator with discretely controlled multiple motions of the present invention.
Figure 1B:
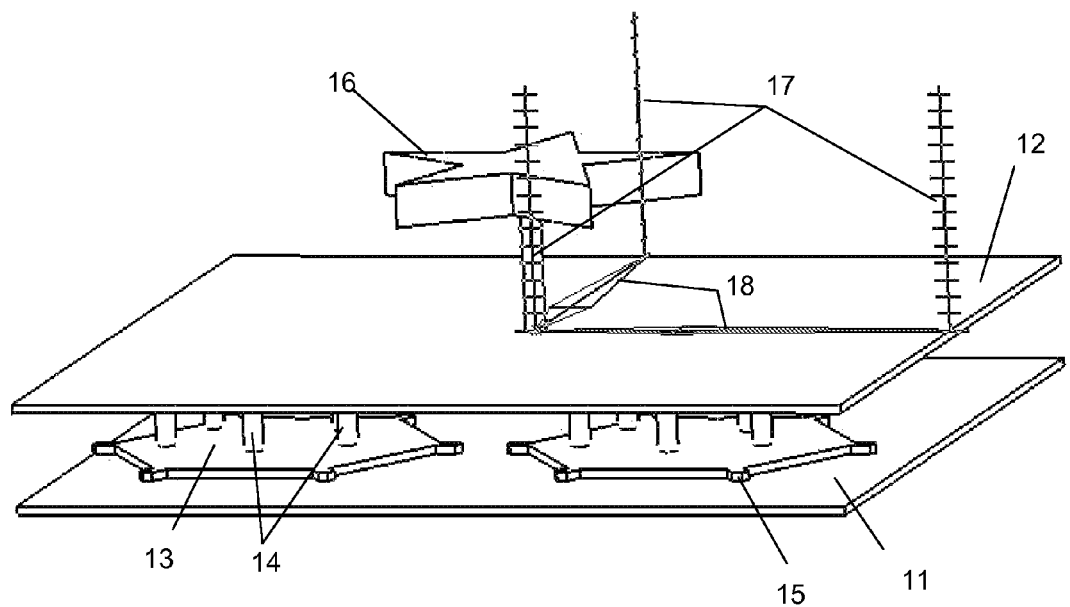
Figure 1C:
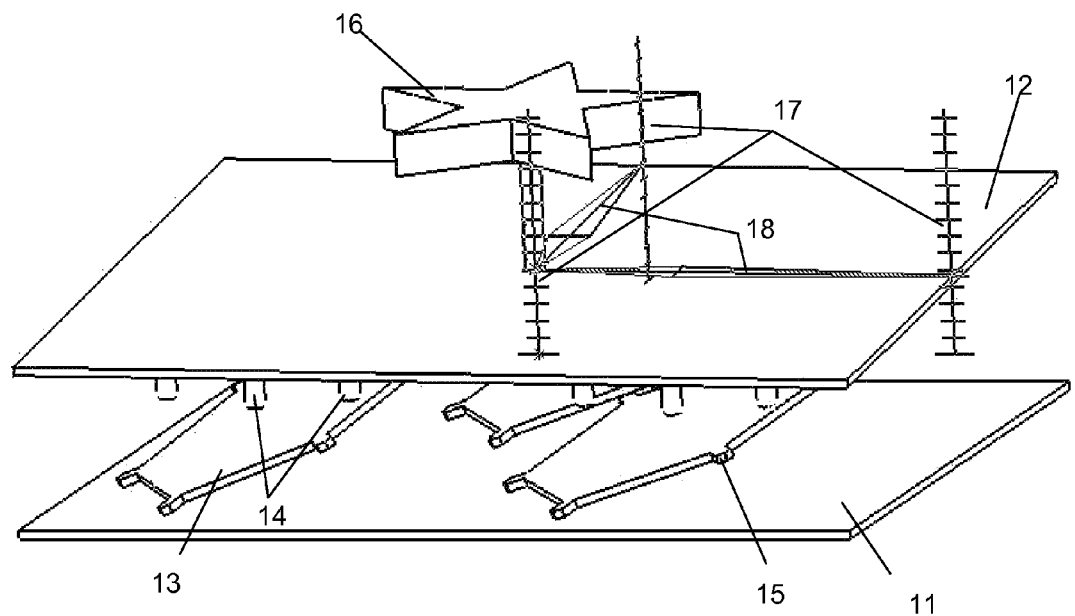

FIG. 1a-1c shows schematic diagram of the MEMS actuator with discretely controlled multiple motions of the present invention. FIG. 1a shows the simple illustration of the MEMS actuator with discretely controlled multiple motions of the present invention. A motion plate 12 is controlled to have discrete motions, which is controlled by stepper plates 13 and corresponding supports 14. The motion plate 12 moves with an object 16 of regards. Since the object 16 is directly connected with the motion plate 12, the control of the motion plate 12 is directly converted to the motion of the object 16.

The MEMS (micro electro mechanical system) actuator with discretely controlled multiple motions of the present invention comprises a bottom layer 11 having control circuitry, at least one stepper plate 13, at least one support, wherein each support 14 is geometrically coupled to the corresponding stepper plate 13 to define motion, and a motion plate 12 having pre-determined multiple motions supported by the stepper plates 13 and the supports 14.

The motions of the motion plate 12 can be pre-programmed by the supports 14 and the stepper plates 13 and each of the pre-programmed motions of the motion plate 12 is provided by actuating a predetermined set of stepper plates 13. Each support 14 in the present invention is geometrically coupled to the corresponding stepper plate 13 to define motion and the motion plate 12 has pre-determined multiple motions supported by the stepper plates 13 and the supports 14. The stepper tip structure 15 is applied to reduce the stiction problem of the structures.

The MEMS actuator of the present invention has simpler control system. Once the motion is defined and programmed in the motion plate structure, the control is just applying the on/off voltage for desired channel with respect to the desired motion. No feedback is required and the motion is reproducible regardless of the environment. Also multiple stepwise voltages can be applied to the desired channel for optimized motion and voltage.

In FIGS. 1b-1c, the motion of the MEMS actuator is illustrated. FIG. 1b shows the initial motion of the controlled object 16 and the motion plate 12. The stepper plate 13 is initially aligned along with bottom layer 11. In the FIGS. 1a-1c, the motion plate bottom supports 14 define the motion of the motion plate 12 and thus the object 16. To see the clear motion difference, the motion grid lines 17 and the clock hand like indication arrows 18 are drawn with the structures. With the grid line 17, the translation and the rotation of the motion plate 12 can easily be observed. In FIG. 1c, the stepper plates 13 are inclined with an angle and the supports 14 contact the stepper plate 13. By the contact points of the supports 14 and the stepper plate 13, the motion of the motion plate 12 is defined. And the object 16 has a motion, which can be defined and easily be seen with the grid lines 17 and clock hand like arrows 18.

Figure 2:
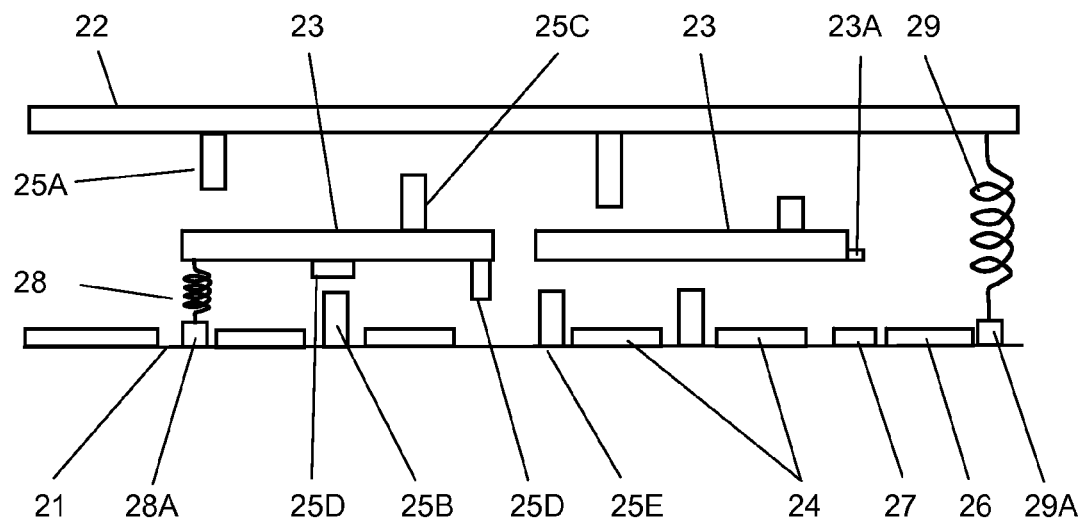
FIG. 2 is a two-dimensional cross-sectional schematic diagram showing the MEMS actuator of the present invention with discretely controlled multiple motions with motion plate.

FIG. 2 is a two-dimensional cross-sectional schematic diagram showing a MEMS actuator with discretely controlled multiple motions, according to the embodiments of the present invention. The MEMS actuator with discretely controlled multiple motions of this invention comprises a bottom layer 21 having control circuitry, a motion plate 22 having a top side and a bottom side, wherein the top side of the motion plate having a connection to a object of regards, at least one stepper plate 23 disposed between the motion plate 22 and the bottom layer 21, wherein each stepper plate 23 has a plurality of stepper plate electrodes 24 configured to actuate the stepper plate 23, and at least one support 25 (25A~25E depending on its location), wherein each support 25 is geometrically coupled to the corresponding stepper plate 23. Motions of the motion plate 22 are pre-programmed by the supports 25 and actuation of the stepper plates 23. Each of the pre-programmed motions of the motion plate 22 is provided by actuating a predetermined set of stepper plates 23.

The stepper plate 23 is configured to have pre-programmed rotations about multiple axes by activating predetermined sets of the stepper plate electrodes 24 using the control circuitry. Motion of the motion plate 22 can be pre-programmed by the positions and geometries of these stepper plates 23. The positions and geometries of the stepper plates 23 are selected during the design process of the MEMS actuator in order to provide the required motions of the motion plate 22 and fabricated accordingly. The stepper plates 23 are actuated by electrostatic force induced by the stepper plate electrodes 24.

The motion plate 22 can be configured to be pulled down to the actuated stepper plates to provide the required motion. In order to do this, the MEMS actuator of the present invention can further comprise at least one motion plate electrode 26, disposed on the bottom layer 21. The motion plate electrodes 26 are configured to pull the motion plate 22 down toward the bottom layer 21 to make the motion plate 22 contact the actuated stepper plates 23.

The MEMS actuator of the present invention can further comprise at least one landing structure 27 in order to reduce a possible stiction problem. The landing structure 27 is disposed on the bottom layer 21, isolated electronically, and configured to stop the rotation of the stepper plate 23 by contacting the actuated stepper plate 23. In addition, the stepper plate 23 can have at least one stepper plate tip 23A, configured to contact the bottom layer 21 or landing structure 27 for reducing the contact area of the actuated stepper plate 23 with the bottom layer 21 or landing structure 27 to reduce the stiction problem.

The motion range of the motion plate 22 can be increased by using various supports 25 that are geometrically coupled to the motion plate 22 directly or indirectly through the stepper plates 23. The required motions of the motion plate 22 can be precisely pre-programmed by properly choosing the positions and geometries of these supports 25. The positions and geometries of the supports are selected in the design process of the MEMS actuator in order to provide the required motions of the motion plate 22 and fabricated accordingly.

The supports can be motion plate bottom supports 25A located under the motion plate 22. Each of the motion plate bottom supports 25A is geometrically coupled to the stepper plate 23, and configured to define motion of the motion plate 22, wherein one end is disposed on the bottom side of the motion plate 22 and the other end is configured to contact the stepper plate 23 when the stepper plate 23 is actuated.

The supports can be stepper plate inner supports 25B. The stepper plate inner support 25B is disposed on the bottom layer 21 and is configured to contact the stepper plate 23 to form a pivotal point for rotation of the stepper plate 23 when the stepper plate 23 is actuated. Also, the stepper plate inner support 25B can be configured to support the stepper plate 23.

The supports can be stepper plate top supports 25C. Each of the stepper plate top supports 25C is configured to define motion of the motion plate 22, wherein one end is disposed on the top side of the stepper plate 23 and the other end is configured to contact the bottom side of the motion plate 22 when the stepper plate 23 is actuated.

The supports can be stepper plate bottom supports 25D. Each of the stepper plate bottom supports 25D is configured to define the rotation of the stepper plate 23, wherein one end is disposed on the bottom side of the stepper plate 23 and the other end is configured to contact the bottom layer 21, landing structures 27, or the stepper plate inner support 25B when the stepper plate 23 is actuated.

The supports can be bottom layer supports 25E. Each of the bottom layer supports 25E is configured to define rotation of the stepper plate 23, wherein one end is disposed on the bottom layer 21 and the other end is configured to contact the stepper plate 23 when the stepper plate 23 is actuated.

Supports defining rotation of the stepper plate 23 such as stepper plate bottom support 25D, stepper plate inner support 25B, and bottom layer supports 25E define the motion of the motion plate 22 indirectly while supports such as the motion plate bottom support 25A and the stepper plate top supports 25C define the motion of the motion plate directly.

The MEMS actuator of the present invention can use one only type of supports 25 to pre-program the required motions of the motion plate 22. Also, The MEMS actuator of the present invention can use various types of supports 25 together to pre-program the required motions of motion plate 22 with proper combinations.

The MEMS actuator with discretely controlled multiple motions further comprises at least one stepper plate spring 28, wherein each of the stepper plate spring 28 is configured to provide elastic restoring force to the stepper plate 23 and connect the stepper plate 23 with the bottom layer 21 or the stepper plate inner support 25B. One end of the stepper plate spring 28 is attached to the stepper plate 23 or a stepper plate spring post (not shown) disposed on the stepper plate 23. The other end of the stepper plate spring 28 can be attached to the bottom layer 21 or a stepper plate spring post 28A disposed on the bottom layer 21. Also, the other end of the stepper plate spring 28 can be attached to the stepper plate inner support 25B or a stepper plate spring post (not shown) disposed on the stepper plate inner support 25B.

The MEMS actuator with discretely controlled multiple motions further comprises at least one motion plate spring 29, wherein each of the motion plate springs 29 is configured to provide elastic restoring force to the motion plate 22 and connect the motion plate 22 with the bottom layer 21. One end of the motion plate spring 29 is be attached to the bottom side of the motion plate 22 or a first motion plate spring post (not shown) disposed on the bottom side of the motion plate 22. The other end of the motion plate spring 29 can be attached to the bottom layer 21 or a second motion plate spring post 29A disposed on the bottom layer 21.

Figure 3A:
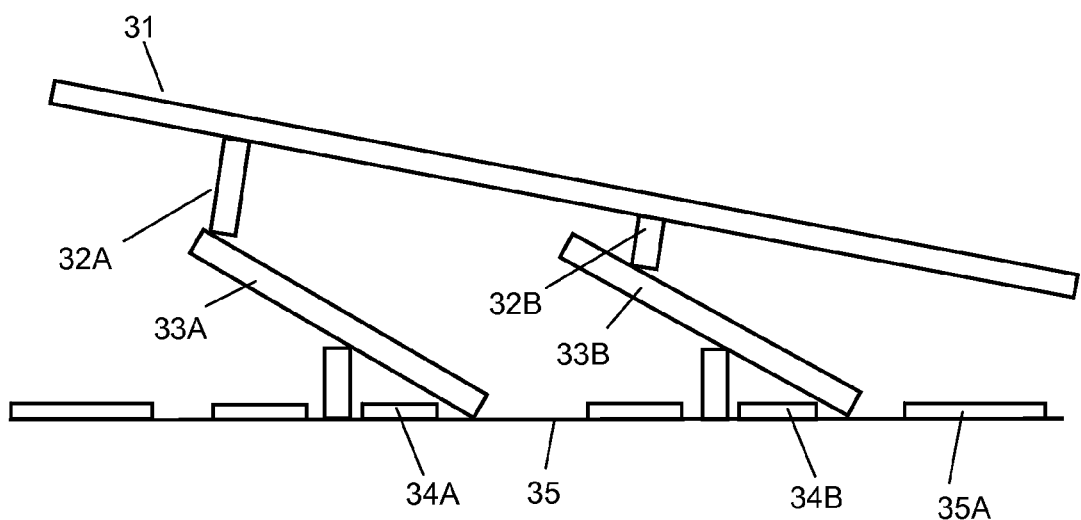
FIGS. 3a-3c show schematically how various types of supports can affect the motion of a motion plate.
Figure 3B:
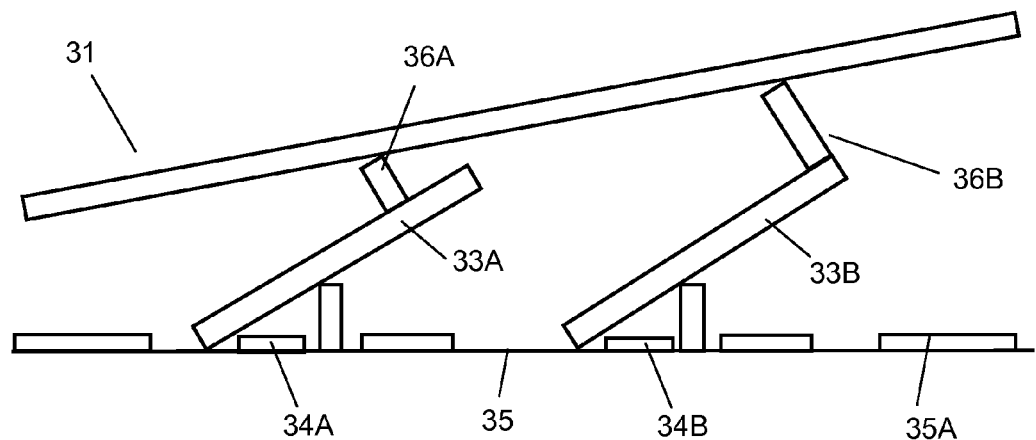
Figure 3C:
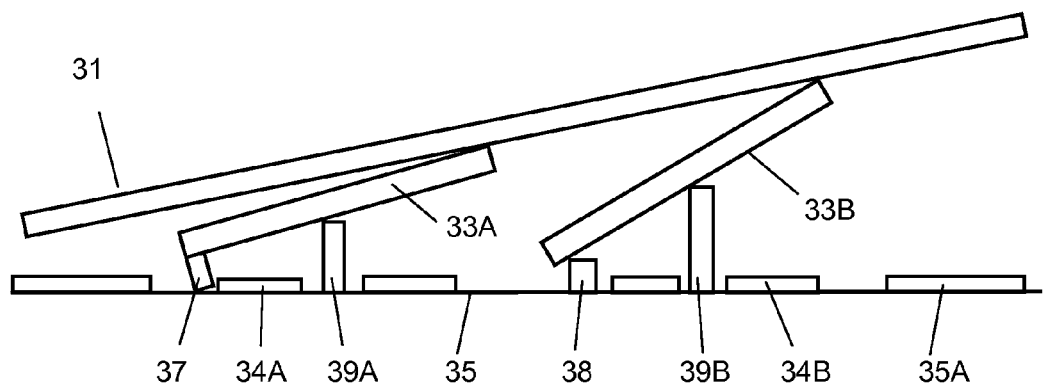

FIGS. 3a-3c show schematically how various types of supports can affect the motion of a motion plate 31. FIG. 3a shows a motion plate 31 having motion plate bottom supports 32A, 32B. The stepper plates 33A, 33B are inclined by a pre-programmed angle when a driving voltage is applied to the stepper plate electrodes 34A, 34B. The motion plate bottom supports 32A, 32B are upheld by the actuated stepper plates 33A, 33B and the motion plate 31 has a motion defined by the contacting positions of the motion plate bottom support 32A, 32B with the stepper plate 33A, 33B. Motion plate electrodes 35A can be used to pull down the motion plate 31 toward a bottom layer 35 in order to make the motion plate bottom supports 32A, 32B to be rested on the stepper plates 33A, 33B. The motion of the motion plate 31 is defined by the geometry of the MEMS actuator of the present invention including positions and heights of the motion plate bottom supports 32A, 32B.

FIG. 3b shows stepper plates 33A, 33B having stepper plate top supports 36A, 36B. The stepper plates 33A, 33B are inclined by a pre-programmed angle when a driving voltage is applied to the stepper plate electrodes 34A, 34B. The stepper plate top supports 36A, 36B uphold the motion plate 31 and the motion plate 31 has a motion defined by the contacting positions of the motion plate 31 with the stepper plate top supports 36A, 36B. Motion plate electrodes 35A can be used to pull down the motion plate 31 toward a bottom layer 35 in order to make the motion plate 31 to be rested on the stepper plate top supports 36A, 36B. The motion of the motion plate 31 is defined by the geometry of the MEMS actuator of the present invention including positions and heights of the stepper plate top supports 36A, 36B that uphold the motion plate 31.

FIG. 3c shows how the motion of a motion plate 31 is defined by stepper plate bottom supports 37, bottom layer supports 38, and stepper plate inner support 39A, 39B. A mechanical stop is applied to the MEMS actuator of the present invention to determine the amounts of the rotational angle of the stepper plate 33A, 33B. In this example, one stepper plate 33A has the stepper plate bottom supports 37 while the other stepper plate 33B has the bottom layer supports 38. The amounts of the rotation angles of the stepper plates 33A, 33B are determined by positions and heights of the stepper plate bottom supports 37, the bottom layer supports 38, and the stepper plate inner supports 39A, 39B or even the existence thereof. The actuated stepper plates 33A, 33B uphold the motion plate 31 and determine the motion of the motion plate 31. These supports limit or extend the rotation of the stepper plates 33A, 33B to provide the required motions of the motion plate 31.

The motion of the motion plate 31 can be defined by various combinations of these supports including motion plate bottom supports 32, stepper plate top supports 36, stepper plate bottom supports 37, bottom layer supports 38, and stepper plate inner supports 39. Any combination of these supports can be used to pre-program the required motions of the motion plate 31 even though FIGS. 3a, 3b, and 3c don't show all cases. Also, the positions and heights of these supports are chosen in the design process to provide the required motions of the motion plate 31, which allows the precise motion generation and control of the motion plate 31.

Figure 4A:
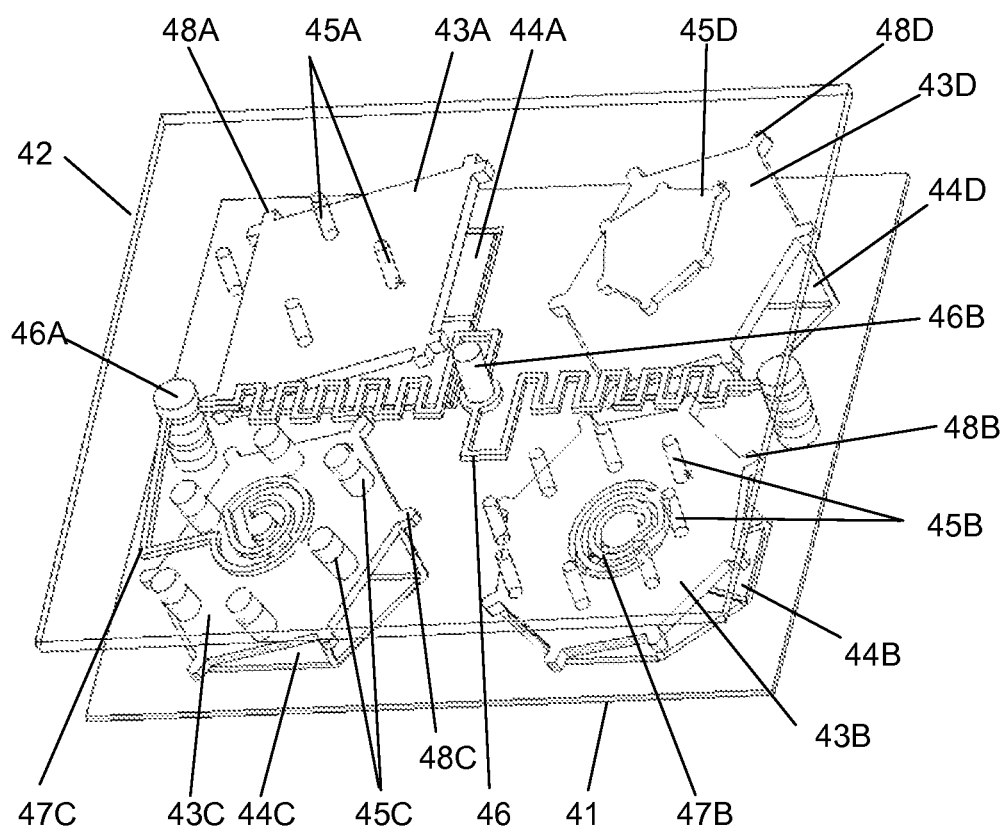
FIGS. 4a-4b are a three-dimensional schematic perspective diagram of the MEMS actuator of the present invention with discretely controlled multiple motions showing various types of supports and various shapes of stepper plates from different points of view.
Figure 4B:
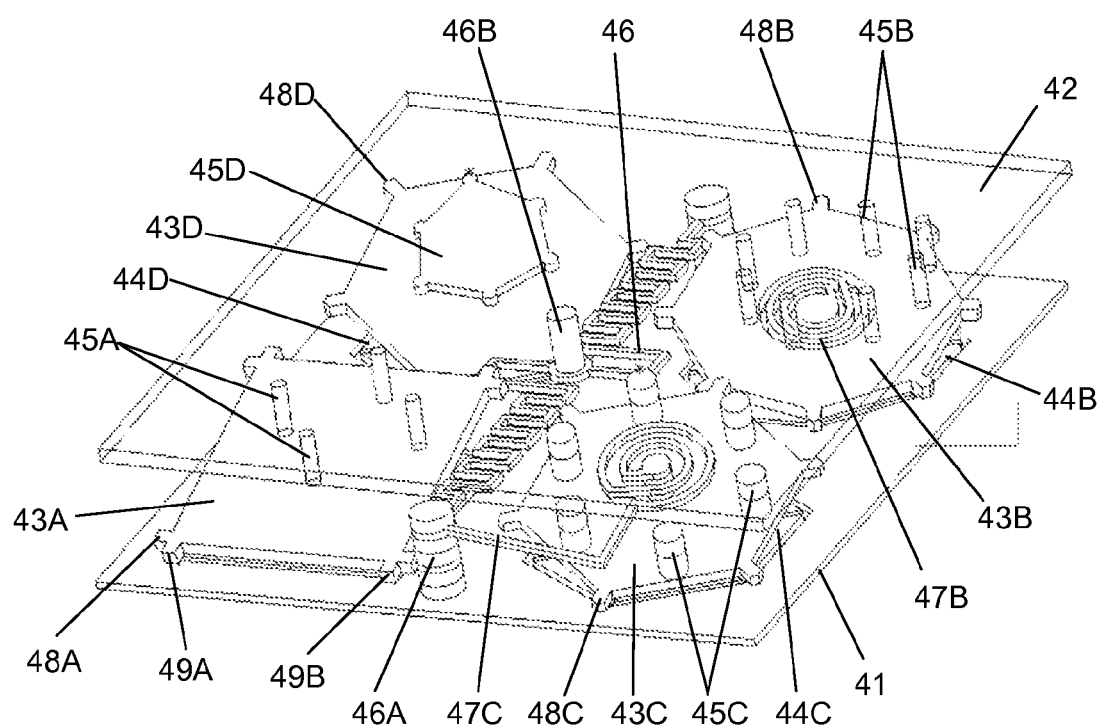

FIGS. 4a-4b are three-dimensional schematic perspective diagrams of the MEMS actuator of the present invention showing various types of supports and various shapes of stepper plates. The MEMS actuator of the present invention shown in FIG. 4 is used for only illustrative purpose in order to help the understanding of this invention. In practical use, each stepper plate can have the same configuration for simpler fabrication and easier operation as well as various configurations for precise motion pre-programming.

The MEMS actuator of the present invention in FIG. 4a comprises a bottom layer 41, a motion plate 42, and at least one stepper plate 43A, 43B, 43C, 43D. Stepper plates 43A, 43B, 43C, 43D has corresponding stepper plate electrodes 44A, 44B, 44C, 44D and corresponding supports, respectively. The stepper plate 43A, 43B has motion plate bottom supports 45A, 45B as the support structures, respectively. The stepper plate 43C, 43D has stepper plate top supports 45C, 45D as the corresponding supports, respectively. Motion plate springs 46 connect the bottom layer 41 with the motion plate 42, wherein one end is attached to a motion plate spring post 46A disposed on the bottom layer 41, and the other end is attached to a motion plate spring post 46B disposed on the bottom side of the motion plate 42. Stepper plate springs connect the corresponding stepper plates 43 with the bottom layer 41 or corresponding stepper plate inner supports, respectively. The stepper plates 43A, 43D have the stepper plate springs (not shown) under the bottom side of the stepper plates 43A, 43D. The stepper plates 43B has the stepper plate spring 47B in the same level as the stepper plate 43C and the stepper plates 43C has the stepper plate spring 47C above the top side of the stepper plate 43B. Also, stepper plates 43A, 43B, 43C, 43D have stepper plate tips 48A, 48B, 48C, 48D to reduce the contact area with the bottom layer 41. Each actuated stepper plate has a contact point that determines the motion of the motion plate. The contact points determining the motion of the motion plate are indicated as asterisk (*). FIG. 4b shows the MEMS actuator structures of FIG. 4a viewed from the different point of view, wherein the configurations of some elements are viewed better. In this view, the configurations of the motion plate bottom supports 45A, 45B and the stepper plate top supports 45C, 45D can be observed clearly. The motion plate bottom supports 45A, 45B are attached to the bottom side of the motion plate 42 while the stepper plate top supports 45C, 45D are attached to the top side of the corresponding stepper plate 43C, 43D. Also, the configuration of the motion plate spring post 46A on the bottom layer 41 and the motion plate spring post 46B on the bottom side of the motion plate 42 can be observed clearly. The first motion plate spring post 46A is attached on the bottom layer 41 while the second motion plate spring post 46B is attached on the bottom side of the motion plate 42. Also, FIG. 4b shows that some stepper plates can be configured to have multiple contact points with the bottom layer 41 when the stepper plates are actuated, which provides the stability of the stepper plate rotation. For example, the stepper plate 43A is configured to have two contact points with the bottom layer 41 by making two stepper plate tips contact the bottom layer 41 for each rotation of the stepper plate 43A. In this case, two stepper plate tips 49A, 49B contact the bottom layer 41. The detail description of each stepper plate and motion generation shown in FIG. 4a is further described in FIGS. 5, 6, 7, and 8.

Figure 5:
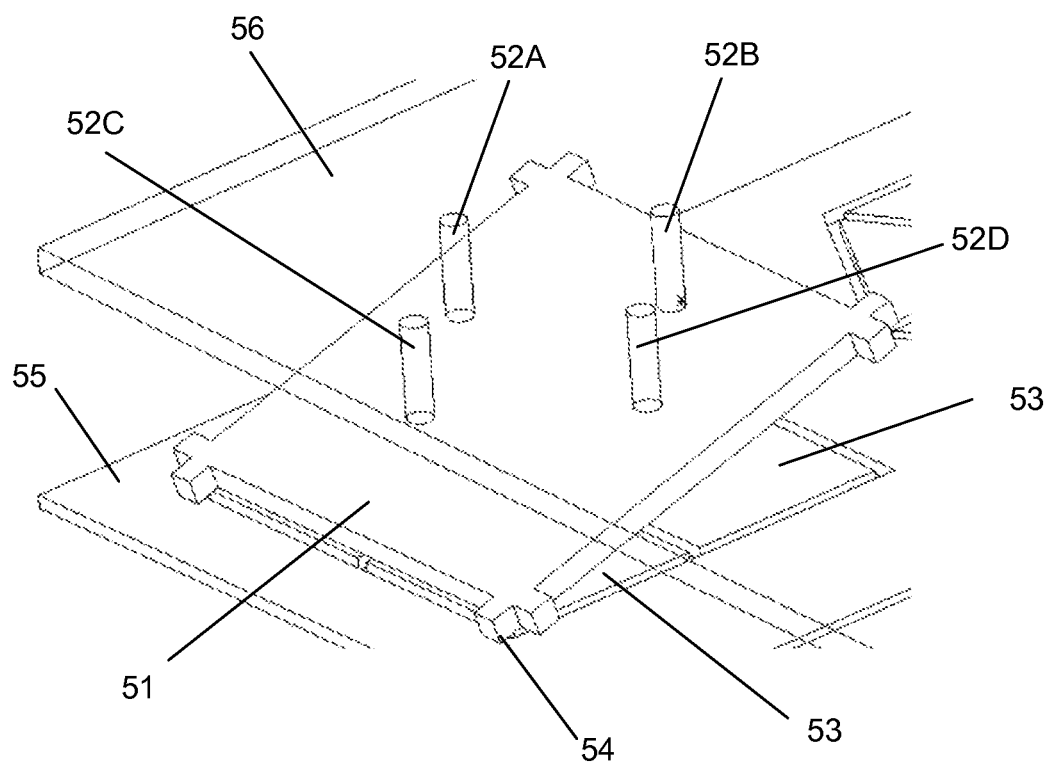
FIG. 5 is a schematic illustration of the MEMS actuator of the present invention showing how motion of the motion plate is controlled using a square shaped stepper plate and quadruple motion plate bottom supports.

FIG. 5 is a schematic illustration of the MEMS actuator showing how motion of a motion plate is controlled using a square shaped stepper plate 51 and quadruple motion plate bottom supports for providing multiple motions. The square shaped stepper plate 51 has quadruple motion plate bottom supports 52A, 52B, 52C, 52D disposed on the bottom side of the motion plate 56 and quadruple stepper plate electrodes 53 corresponding to the motion plate motions. The stepper plate 51 is configured to have at least four pre-programmed rotations by activating predetermined sets of stepper plate electrodes 53. When a predetermined set of stepper plate electrodes 53 are activated, the stepper plate 51 is actuated to have a pre-programmed rotation. Then, the actuated stepper plate 51 is rotated and snapped down to the direction of the activated stepper plate electrodes 53. At least one stepper plate tip 54 of the rotated stepper plate 51 contacts the bottom layer 55 or a landing structure and the top side of the stepper plate 51 contacts one of the motion plate bottom supports 52A, 52B, 52C, 52D. The contact point between the stepper plate 51 and the contacted motion plate bottom support 52A is indicated as asterisk. The motion of the motion plate 56 depends on the position and height of the contacted motion plate bottom support 52A. In this example, the stepper plate spring (not shown) connecting the stepper plate 51 with the bottom layer 55 or a stepper plate inner support is disposed under the stepper plate 51. The positions and the heights of the motion plate bottom supports 52A, 52B, 52C, 52D are determined to provide the required motions of the motion plate 56 during design process and fabrication process of the motion plate device. To have larger electrostatic force or lower driving voltage, electric bias can be applied to two or more stepper plate electrodes 53 at the same time. Although this example shows the case using the motion plate bottom supports 52A, 52B, 52C, 52D, the motion of the motion plate 56 can be pre-programmed by using various combinations of motion plate bottom supports, stepper plate top supports, stepper plate bottom supports, stepper plate inner supports, and bottom layer supports.

Figure 6A:
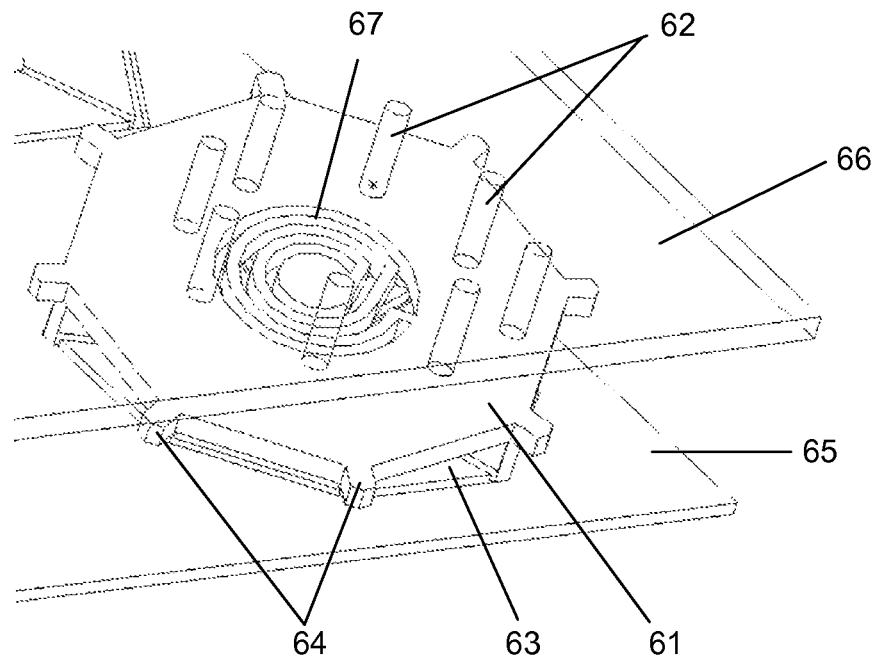
FIGS. 6a-6c are a schematic illustration of the MEMS actuator of the present invention showing how motion of the motion plate is controlled using an octagonal shaped stepper plate and eight motion plate bottom supports from different points of view.
Figure 6B:
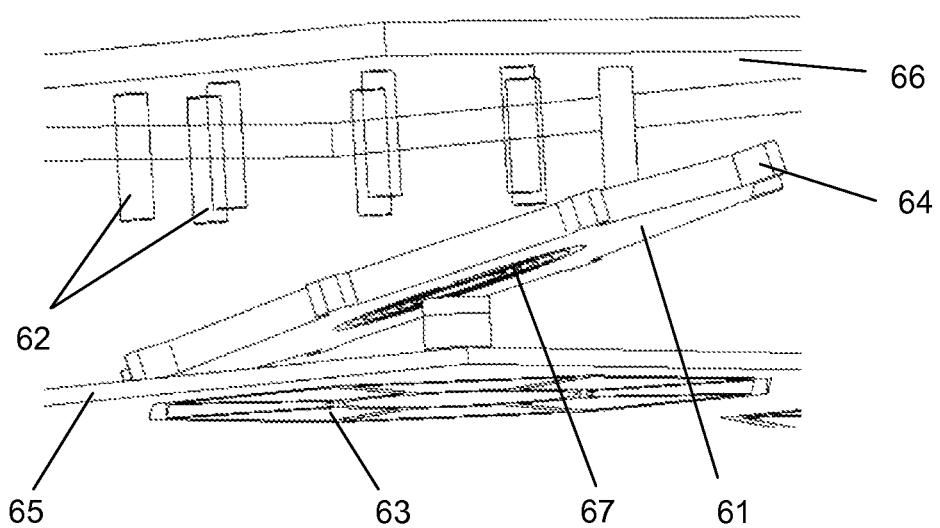
Figure 6C:
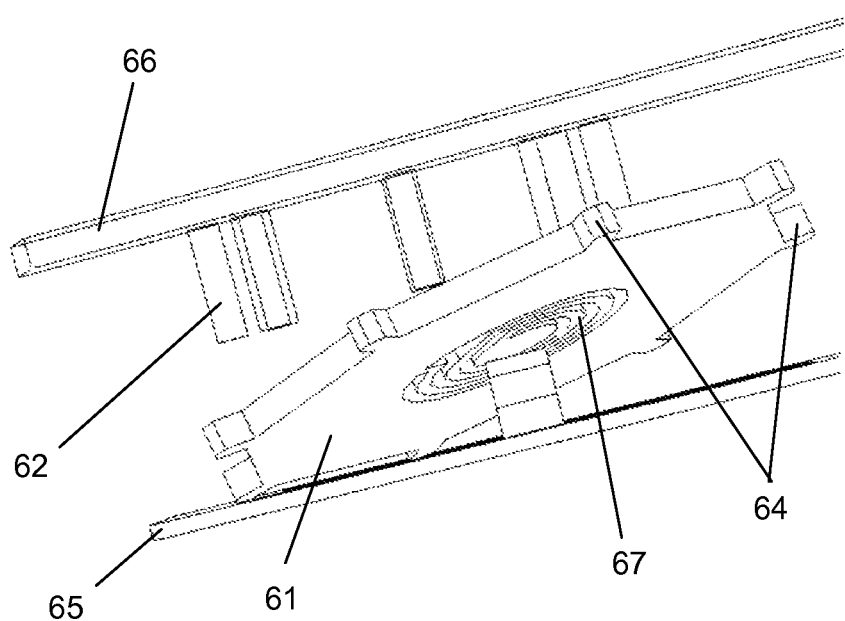

FIGS. 6a-6c are a schematic illustration of the MEMS actuator of the present invention from the different points of view showing how the motion of a motion plate 66 is controlled using an octagonal shaped stepper plate and eight motion plate bottom supports 62 for providing multiple motions of the motion plate. FIGS. 6a, 6b, 6c show the portion of the DCM viewed from the different points of view (top, side, and bottom). The octagonal shaped stepper plate 61 has eight motion plate bottom supports 62 disposed on the bottom side of the motion plate and eight stepper plate electrodes 63. The stepper plate 61 is configured to have at least eight pre-programmed rotations by activating predetermined sets of stepper plate electrodes 63. When a predetermined set of stepper plate electrodes 63 are activated, the stepper plate 61 is actuated to have a pre-programmed rotation. Then, the actuated stepper plate 61 is rotated and snapped down to the direction of the activated stepper plate electrodes 63. The stepper plate tip 64 of the actuated stepper plate 61 contacts the bottom layer 65 or a landing structure and the top side of the stepper plate 61 contacts one of the motion plate bottom supports 62. The contact point between the stepper plate 61 and the contacted motion plate bottom support 62 is indicated as asterisk. Motion of the motion plate 66 depends on the position and height of the contacted motion plate bottom support 62. The positions and the heights of the motion plate bottom supports 62 are determined to provide the required motions of the motion plate in the design process and fabricated during making process of the motion plate device. Unlike the case in the FIG. 5, wherein the stepper plate spring is disposed under the bottom side of the stepper plate, the stepper plate spring 67 of this example is disposed on the same level as that of the stepper plate 61 as shown in FIG. 6, which can yield a simpler fabrication process. In this example, the MEMS actuator works in the same manner as the case in quadruple motion plate bottom supports in FIG. 5, but provides more number of motions and finer motion control of the motion plate 66. In FIG. 6b, the configuration of the motion plate bottom supports 62 can be viewed better. The motion plate bottom supports 62 are attached to the bottom side of the motion plate 66 and the actuated stepper plate 61 is configured to contact one of the motion plate bottom supports 62. In this case, the actuated stepper plate 61 contacts the motion plate bottom support 62.

Figure 7A:
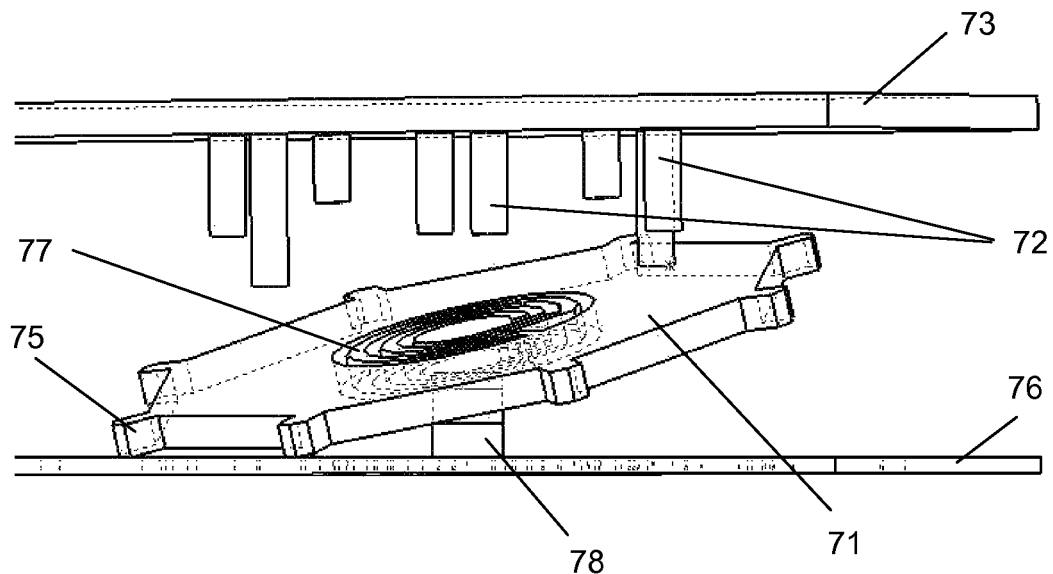
FIGS. 7a-7b are a schematic illustration of the MEMS actuator of the present invention having motion plate bottom supports with different heights from different points of view.
Figure 7B:
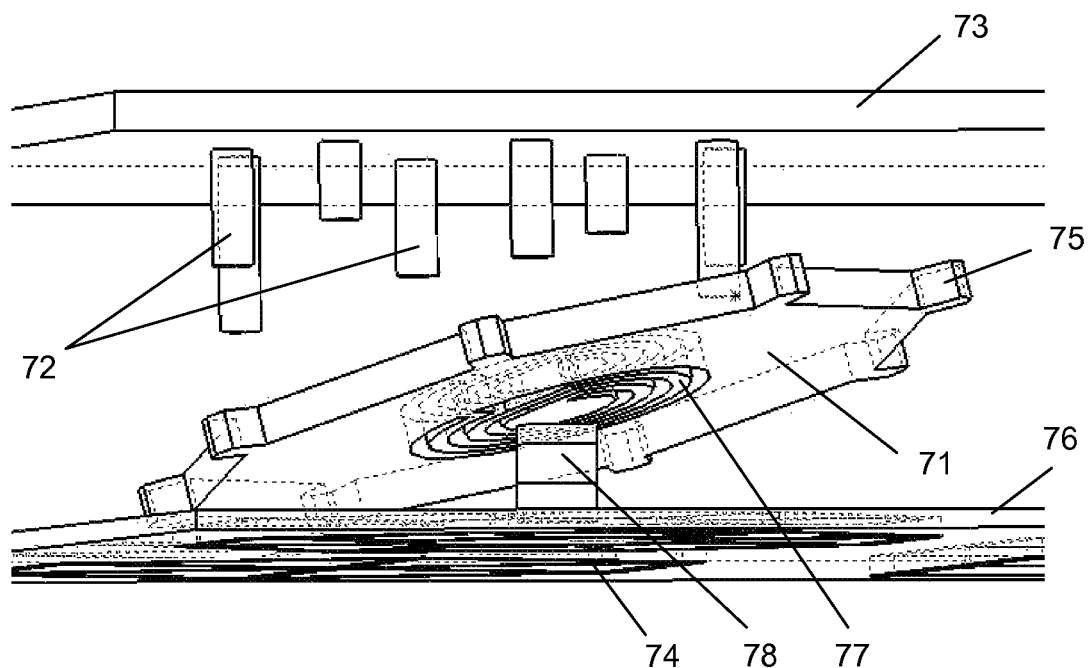

While the motion plate bottom supports shown in FIG. 6 have the same height, wherein FIG. 6c provides a clear view for observing the height of the motion plate bottom supports, the motion plate bottom supports can have variation in height as shown in FIGS. 7a-7b. FIGS. 7a and 7b are schematic illustrations of the MEMS actuator of the present invention having motion plate bottom supports with different heights, viewed in two different directions. The MEMS actuator of the present invention is controlled using an octagonal shaped stepper plate 71 and eight motion plate bottom supports 72 having different heights for providing multiple motions of the motion plate 73. The stepper plate 71 has eight motion plate bottom supports 72 disposed on the bottom side of the motion plate 73 and eight stepper plate electrodes 74. The stepper plate 71 is configured to have at least eight pre-programmed rotations by activating predetermined sets of stepper plate electrodes 74. When a predetermined set of stepper plate electrodes 74 are activated, the stepper plate 71 is actuated to have a pre-programmed rotation. Then, the actuated stepper plate 71 is rotated and snapped down to the direction of the activated stepper plate electrodes 74. The stepper plate tip 75 of the actuated stepper plate 71 contacts the bottom layer 76 or a landing structure and the top side of the stepper plate 71 contacts one of the motion plate bottom supports 72. The contact point between the stepper plate 71 and the contacted motion plate bottom support 72 is indicated as asterisk. The motion of the motion plate 73 depends on the position and height of the contacted motion plate bottom support 72. The positions and the heights of the motion plate bottom supports 72 are determined to provide the required motions of the motion plate 73 in the design process and fabricated during making process of the motion plate device. By using the motion plate bottom supports 72 having variation in height, the motion of the motion plate 73 can be precisely pre-programmed to provide the required motions of the motion plate 73. As a result, the motion control accuracy of the DCM can increase. Also, the motion range of the motion plate can be increased.

FIG. 7 also show an exemplary configuration of a stepper plate spring. The stepper plate 71 has the stepper plate spring 77 in the same level as the stepper plate 71. The stepper plate spring 77 is configured to provide elastic restoring force to the stepper plate 71 and connect the stepper plate 71 with the bottom layer 76 or the stepper plate inner support (not shown). One end of the stepper plate spring 77 is attached to the stepper plate 71 or a stepper plate spring post (not shown) disposed on the stepper plate 71. The other end of the stepper plate spring 77 can be attached to the bottom layer 76 or a stepper plate spring post 78 disposed on the bottom layer 76. Also, the other end of the stepper plate spring 77 can be attached to the stepper plate inner support or a stepper plate spring post disposed on the stepper plate inner support.

Figure 8A:
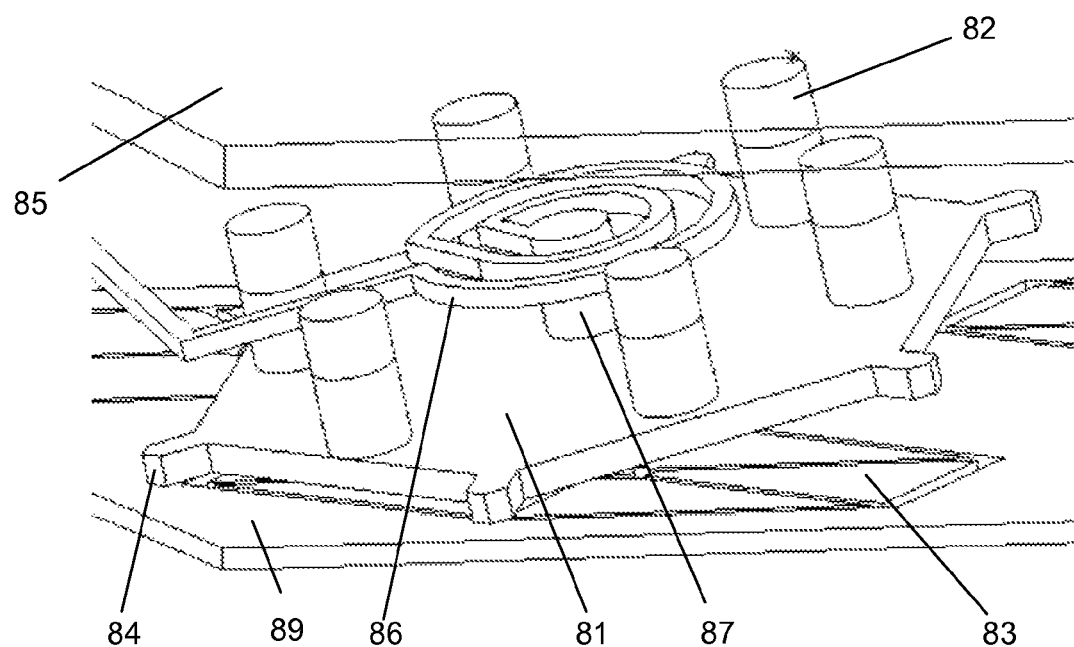
FIGS. 8a-8b are a schematic illustration of the MEMS actuator of the present invention showing how motion of the motion plate is controlled using a hexagonal shaped stepper plate and six stepper plate top supports from different points of view.
Figure 8B:
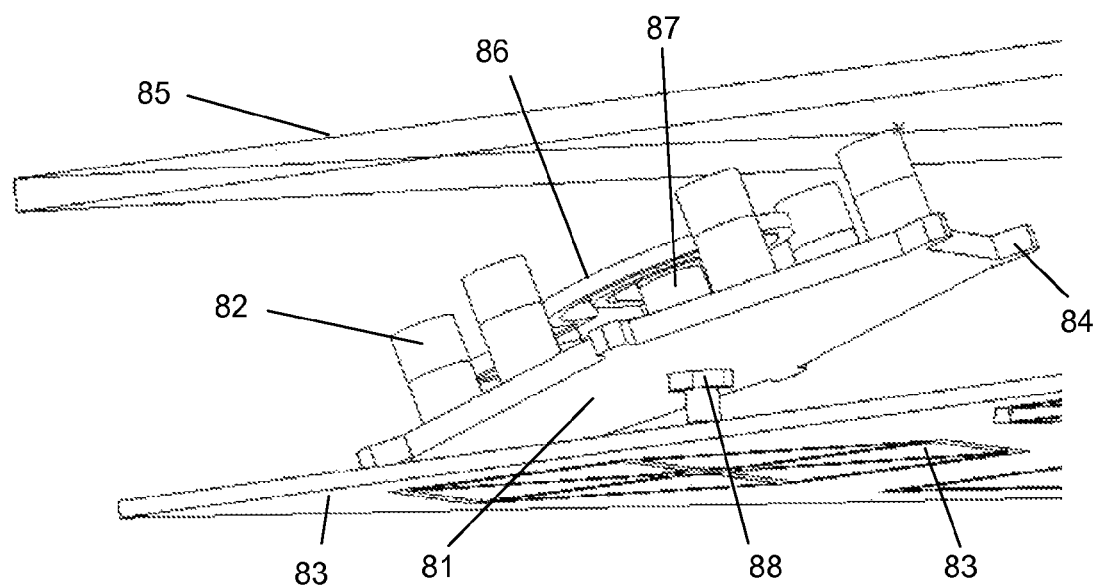

FIGS. 8a-8b are a schematic illustration of the MEMS actuator of the present invention showing how the motion of a motion plate is controlled using a hexagonal shaped stepper plate and six stepper plate top supports for providing multiple motions of the motion plate. The hexagonal shaped stepper plate 81 has six stepper plate top supports 82 disposed on the top side of the stepper plate 81 and six stepper plate electrodes 83. The stepper plate 81 is configured to have at least six pre-programmed rotations by activating predetermined sets of stepper plate electrodes 83. When a predetermined set of stepper plate electrodes 83 are activated, the stepper plate 81 is actuated to have a pre-programmed rotation. Then, the actuated stepper plate 81 is rotated and snapped down to the direction of the activated stepper plate electrodes 83. The stepper plate tip 84 of the actuated stepper plate 81 contacts the bottom layer 89 or a landing structure and one of the stepper plate top supports 82 disposed on the top side of the stepper plate 81 contacts the bottom side of the motion plate 85. The contact point between the motion plate 85 and the contacted stepper plate top support 82 is indicated as asterisk. The motion of the motion plate 85 depends on the position and height of the contacted stepper plate top support 82. The positions and the heights of the stepper plate top supports 82 are determined to provide the required motions of the motion plate 85 during the design process and fabrication process of the motion plate device. FIG. 8a shows another example of the arrangement of the stepper plate spring. In this example, the stepper plate spring 86 is disposed above the top side of the stepper plate 81, wherein one end is attached to a first stepper plate spring post 87 disposed on the top side of the stepper plate 81 and the other end is attached to the motion plate spring post 46A as shown in FIG. 4.

FIG. 8b also shows another exemplary configuration of a stepper plate inner support. The stepper plate 81 can be supported by a flexible structure such as stepper plate springs 86 and suspended over the stepper plate inner support 88 before the stepper plate 81 is actuated. When the stepper plate 81 is actuated, the stepper plate inner support 88 contacts the actuated stepper plate 81 to form a pivotal point for rotation of the actuated stepper plate 81. The rotation of the actuated stepper plate 81 is pre-programmed by position and height of the stepper plate inner support 88. The positions and geometries of the stepper plate inner supports 88 are selected in the design process of the MEMS actuator in order to provide the required motions of the motion plate 85 and fabricated accordingly.

Figure 9A:
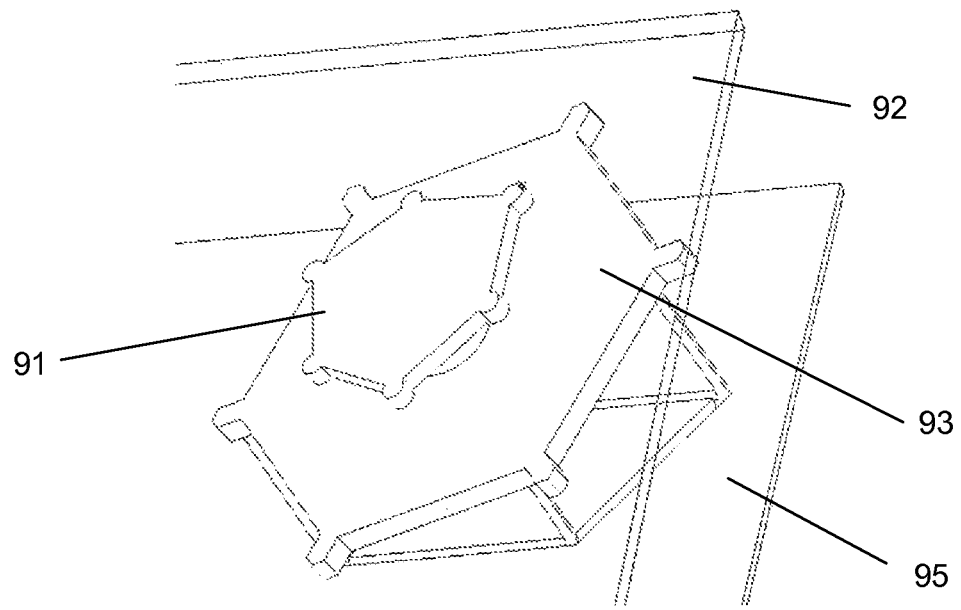
FIGS. 9a-9b show a variation of the configuration of the stepper plate top supports from different points of view.
Figure 9B:
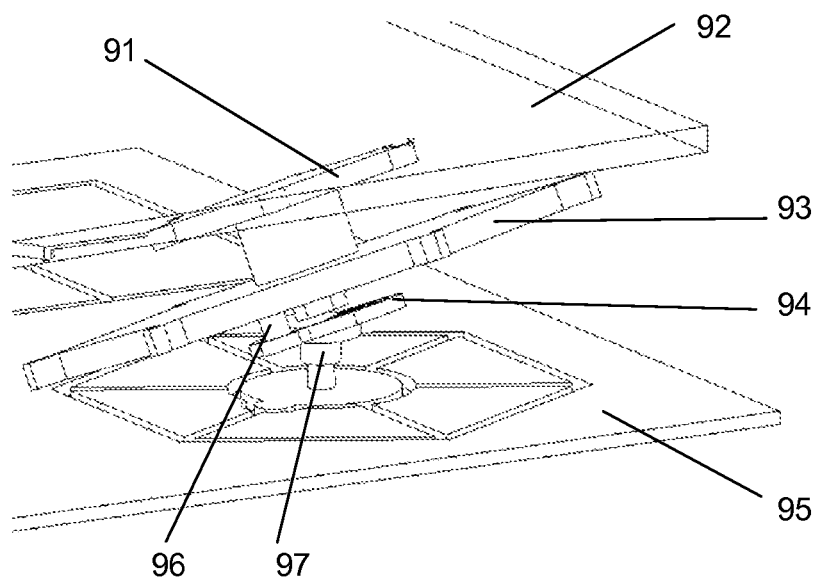

FIGS. 9a-9b show a variation of the configuration of the stepper plate top supports from the different points of view. In stead of using individually separated stepper plate top supports, the same function can be accomplished by using one bodied stepper plate top support structure. For example, the six stepper plate top supports 82 in FIG. 8 can be replaced with one bodied stepper plate top support structure 91 in FIG. 9. The bodied stepper plate top support structure 91 is configured to be able to contact the motion plate 92 at six different positions. Each position contacted by the motion plate 92 can be configured to have variation in height. The contact point between the motion plate 92 and the one bodied stepper top support structure 91 is indicated as asterisk. The concept of the one bodied structure can be applied to other types of supports including motion plate bottom supports, stepper plate bottom supports, and bottom layer supports. The motion plate device can be ruggedized by using these one bodied structures instead of individually separated supports.

FIGS. 9a-9b also show another exemplary configuration of stepper plate spring. The stepper plate 93 has the stepper plate spring 94 disposed under the stepper plate 93. The stepper plate spring 94 is configured to provide elastic restoring force to the stepper plate 93 and connect the stepper plate 93 with the bottom layer 95 or the stepper plate inner support (not shown). In this example, one end of the stepper plate spring 94 is attached to a stepper plate spring post 96 disposed on the bottom side of the stepper plate 93. The other end of the stepper plate spring 94 is attached to a stepper plate spring post 97 disposed on the bottom layer 95.

Figure 10A:
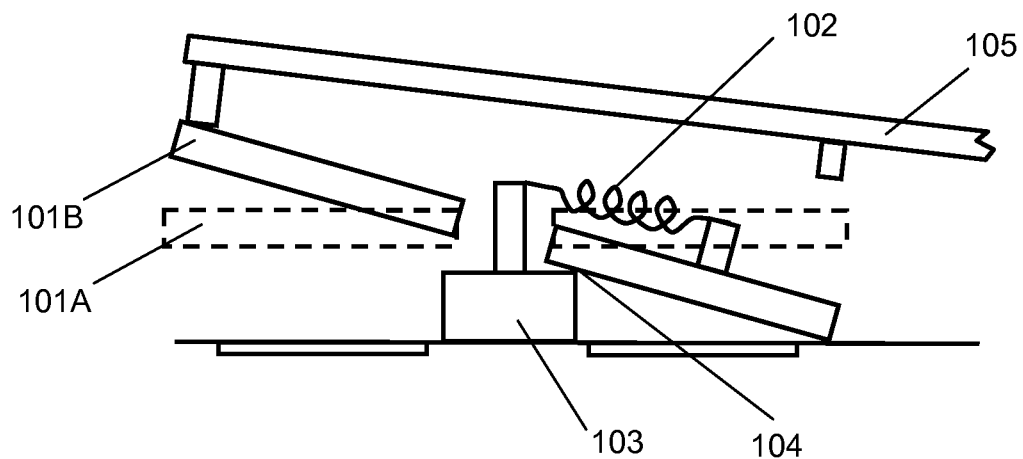
FIGS. 10a-10b show various configurations of the stepper plate inner support.
Figure 10B:
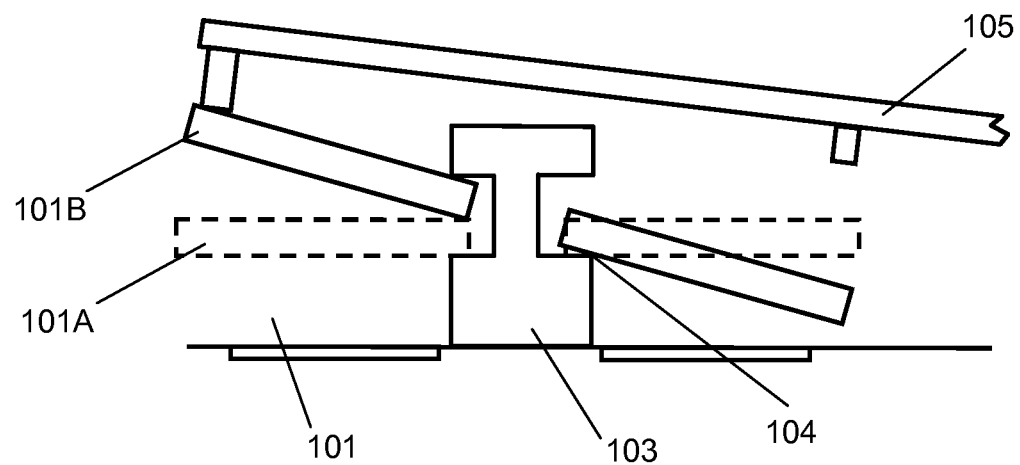

FIGS. 10a-10b show various configurations of stepper plate inner supports. The stepper plate 101A can be supported by a flexible structure such as stepper plate springs 102 and suspended over the stepper plate inner support 103 before the stepper plate 101A is actuated as shown in FIG. 10a. When the stepper plate 101A is actuated, the stepper plate inner support 103 contacts the actuated stepper plate 10B to form a pivotal point 104 for rotation of the actuated stepper plate 101B. The rotation of the actuated stepper plate 101B is pre-programmed by position and height of the stepper plate inner support 103. The positions and geometries of the stepper plate inner supports are selected during the design process of the MEMS actuator in order to provide the required motions of the motion plate 105 and fabricated accordingly. On the other hand, the stepper plate 101A can be supported by the stepper plate inner support 103 regardless of existence of the flexible structures as shown in FIG. 10b. In this case, the stepper plate 101A is supported by the stepper plate inner support 103 before the stepper plate 101A is actuated. When the stepper plate 101A is actuated, the actuated stepper plate 10B rotates about a pivotal point 104 of the stepper plate inner support 103. The rotation of the actuated stepper plate 101B is pre-programmed by position and geometry of the stepper plate inner support 103, which is selected during the design process of the MEMS actuator in order to provide the required motion of the motion plate 105 and fabricated accordingly.

Figure 11A:
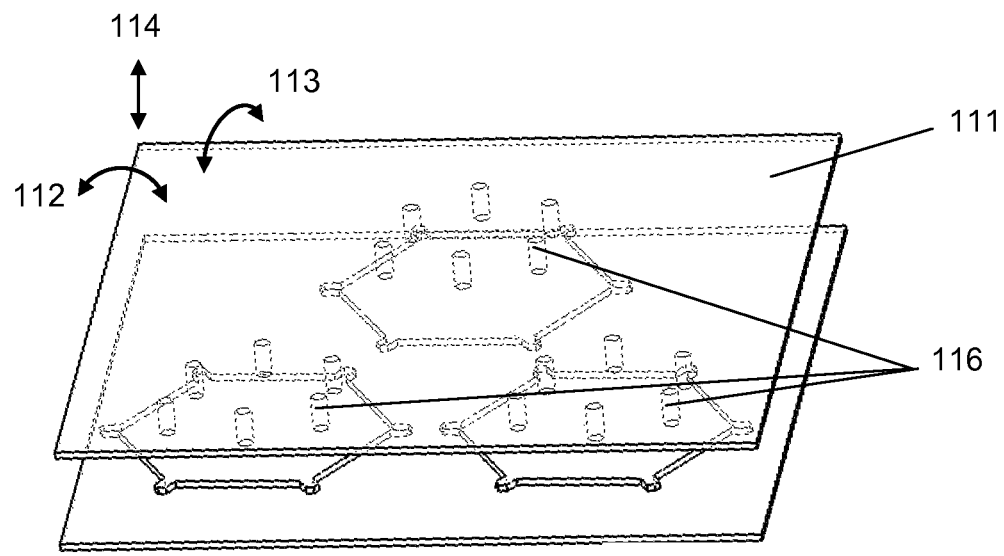
FIGS. 11a-11b show a three-dimensional perspective view of the MEMS actuator of the present invention providing three degrees of freedom motion using motion plate bottom supports when the stepper plates are on and off.
Figure 11B:
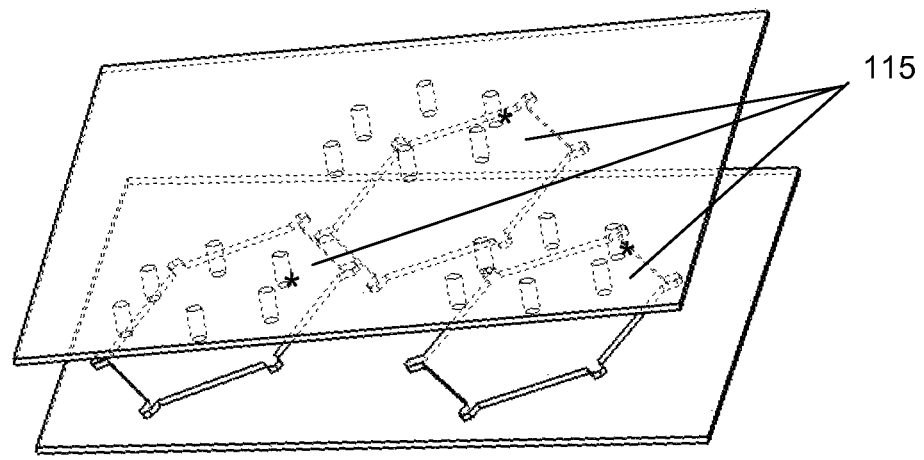

FIGS. 11a-11b show a three-dimensional perspective view of a MEMS actuator of the present invention providing three degrees of freedom motion using motion plate bottom supports. The motion of the motion plate 111 is provided with two degrees of freedom rotation 112, 113 and one degree of freedom translation 114 as shown in FIG. 11a. To provide these three degrees of freedom motion, the MEMS actuator of the present invention preferably actuates at least three stepper plates 115 for each motion as shown in FIG. 11b. In this case, the motion plate 111 can have a stable motion because the motion plate 111 is supported by at least three points. Each stepper plate 115 has pre-programmed rotations determined by the positions and heights of the corresponding motion plate bottom supports 116. The contact points between the stepper plates 115 and the contacted motion plate bottom supports 116 are indicated as asterisk. These contact points of the three stepper plates 115 with the three motion plate bottom supports 116 make a plane for the motion plate 111 representing a motion of the motion plate 111.

Figure 12:
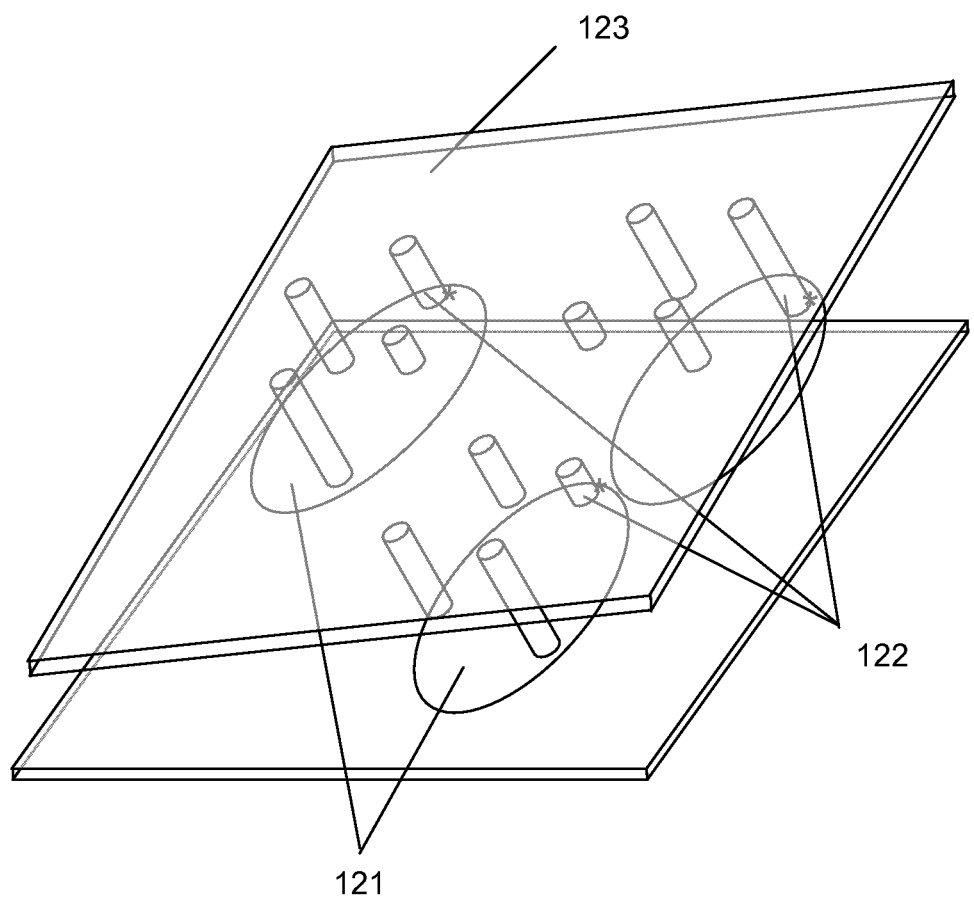
FIG. 12 shows a three-dimensional perspective view of the MEMS actuator of the present invention providing three degrees of freedom motion using motion plate bottom supports having variation in height.

FIG. 12 shows a three-dimensional perspective view of the MEMS actuator of the present invention providing three degrees of freedom motion using motion plate bottom supports having variation in height. Each stepper plate 121 has pre-programmed rotations determined by the positions and heights of the corresponding motion plate bottom supports 122, wherein the motion plate bottom supports 122 can have variation in height. The contact points between the stepper plates 121 and the contacted motion plate bottom supports 122 are indicated as asterisk. These contact points of the three stepper plates 121 with the three motion plate bottom supports 122 make a plane for the motion plate 123 representing a motion of the motion plate 123. By introducing the motion plate bottom supports 122 and allowing the motion plate bottom supports 122 to have variation in height, the motion of the motion plate 123 can be precisely pre-programmed and the motion range of the motion plate 123 can be increased.

Figure 13:
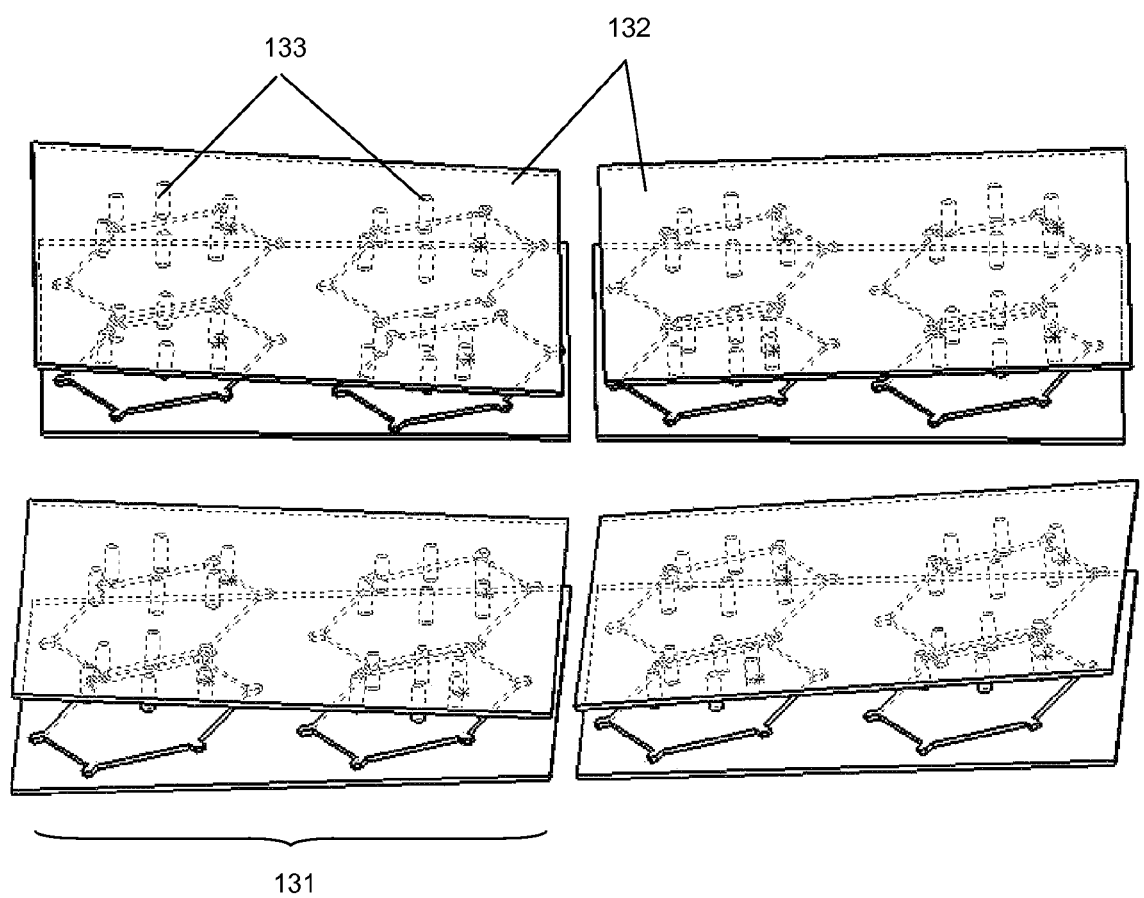
FIG. 13 is a schematic illustration of an array of the MEMS actuator with motion plates of the present invention.

FIG. 13 is a schematic illustration of an array of the MEMS actuator with motions plates of the present invention. As an illustrative purpose, a simple two by two motion plate 131 array is shown, wherein motion of the motion plate 132 is defined by the motion plate bottom supports 133. In practice, the size of the two-dimensional array of the motion plates and the type of the supports defining the motion of the motion plate 132 can be varied according to a considered application. Each motion plate 132 in the array of the motion plates is independently controlled to form desired motion of the MEMS array. The control circuitry can be constructed by using known semiconductor microelectronics technologies such as MOS or CMOS to control the independent motion of the MEMS array.

If the motion plate is built as a mirror for reflecting light, the array of the MEMS actuator with motion plates can be used as an arrayed spatial light modulator. The motion plates 132 in array of the MEMS actuator have independently controlled motions to make an optical phase modulator. The one translational degree of freedom motion of the MEMS actuator 131 with motion plate is controlled to retract or elevate the motion plate 132 to remove the phase aberration of an optical system.

The motion plates 132 in array of the MEMS actuator with motion plates have independently controlled motions to form a spatial light modulator. The one translational degree of freedom motion of the motion plate 132 with motion plate is controlled to retract or elevate the motion plate 132 to remove the phase aberration of an optical system. The one or two rotational degrees of freedom motion of the motion plate 132 with motion plate is controlled to control light intensity and/or to scan a field of regard. By using both rotational degree of freedom motion and translational degree of freedom motion of the motion plate 132, a fine spatial light modulator can be provided.

As a special example of the arrayed motion plates, Micromirror Array Lens is a good example. The general properties of the Micromirror Array Lens are disclosed in U.S. Pat. No. 7,057,826 issued Jun. 6, 2006 to Cho, U.S. Pat. No. 7,173,653 issued Feb. 6, 2007, U.S. Pat. No. 7,215,882 issued May 8, 2007 to Cho, U.S. patent application Ser. No. 10/979,568 filed Nov. 2, 2004, U.S. patent application Ser. No. 11/218,814 filed Sep. 2, 2005, U.S. patent application Ser. No. 11/359,121 filed Feb. 21, 2006, U.S. patent application Ser. No. 11/382,273 filed May 9, 2006, and U.S. patent application Ser. No. 11/429,034 filed May 5, 2006, and its application are disclosed in U.S. Pat. No. 7,077,523 issued Jul. 18, 2006 to Seo, U.S. Pat. No. 7,068,416 issued Jun. 27, 2006 to Gim, U.S. patent application Ser. No. 10/914,474 filed Aug. 9, 2004, U.S. patent application Ser. No. 10/934,133 filed Sep. 3, 2004, U.S. patent application Ser. No. 10/979,619 filed Nov. 2, 2004, U.S. patent application Ser. No. 10/979,624 filed Nov. 2, 2004, U.S. patent application Ser. No. 11/076,688 filed Mar. 10, 2005, U.S. patent application Ser. No. 11/208,114 filed Aug. 19, 2005, U.S. patent application Ser. No. 11/208,115 filed Aug. 19, 2005, U.S. patent application Ser. No. 11/382,707 filed May 11, 2006, U.S. patent application Ser. No. 11/419,480 filed May 19, 2006, and U.S. patent application Ser. No. 11/423,333 filed Jun. 9, 2006, all of which are incorporated herein by references.

While the invention has been shown and described with reference to different embodiments thereof, it will be appreciated by those skills in the art that variations in form, detail, compositions and operation may be made without departing from the spirit and scope of the present invention as defined by the accompanying claims.

The invention claimed is:

1. A MEMS (micro electro mechanical system) actuator with discretely controlled multiple motions comprising:
   a) a bottom layer having control circuitry;
   b) at least one stepper plate having a plurality of stepper plate electrodes, wherein the stepper plate is configured to have a plurality of pre-programmed rotations by activating predetermined sets of the stepper plate electrodes; and
   c) a motion plate having a plurality of motion plate bottom supports, wherein one end of each motion plate bottom support is disposed on the bottom side of the motion plate and the other end of each motion plate bottom support is configured to have a distance from the stepper plate before the stepper plate is actuated and be capable of contacting the stepper plate when the stepper plate is actuated;
wherein each rotation of the stepper plate makes the stepper plate contact at least one of the motion plate bottom supports of the motion plate, which makes the motion plate have a motion, wherein the motions of the motion plate are pre-programmed by the motion plate bottom supports and the stepper plate, wherein each of the pre-programmed motions plate is provided by actuating a predetermined set of the stepper plates.

2. The MEMS actuator with discretely controlled multiple motions of claim 1, wherein the control circuitry is coupled with the stepper plate electrodes and selectively activates the stepper plate electrodes.

3. The MEMS actuator with discretely controlled multiple motions of claim 2, wherein the control circuitry is wire structure directly connected with the stepper plate electrodes to supply voltages.

4. The MEMS actuator with discretely controlled multiple motions of claim 2, wherein the control circuitry is an electrical addressing circuitry.

5. The MEMS actuator with discretely controlled multiple motions of claim 2, wherein the electrical addressing circuitry comprises a plurality of memory type cell forming a memory addressing array.

6. The MEMS actuator with discretely controlled multiple motions of claim 5, wherein the memory addressing array comprises SRAM circuits to activate the stepper plate electrodes.

7. The MEMS actuator with discretely controlled multiple motions of claim 5, wherein the memory addressing array comprises DRAM circuits to activate the stepper plate electrodes.

8. The MEMS actuator with discretely controlled multiple motions of claim 2, wherein the control circuitry comprises a MOS-type or CMOS-type circuitry on the bottom layer.

9. The MEMS actuator with discretely controlled multiple motions of claim 2, wherein the control circuitry is operated by digital voltage.

10. The MEMS actuator with discretely controlled multiple motions of claim 2, wherein the control circuitry supplies discrete control voltage to the stepper plate electrodes.

11. The MEMS actuator with discretely controlled multiple motions of claim 1, wherein each stepper plate is configured to have pre-programmed rotations about multiple axes by activating predetermined sets of the stepper plate electrodes.

12. The MEMS actuator with discretely controlled multiple motions of claim 1, wherein each motion plate bottom support is configured to define a motion of the motion plate when the stepper plate is actuated.

13. The MEMS actuator with discretely controlled multiple motions of claim 1, wherein the motion of the motion plate is defined by the contact points of the motion plate bottom support and the stepper plate top side.

14. The MEMS actuator with discretely controlled multiple motions of claim 1, wherein the stepper plate has at least one stepper plate tip, configured to contact the bottom layer including landing structures for reducing the contact area of the actuated stepper plate with the bottom layer.

15. The MEMS actuator with discretely controlled multiple motions of claim 1, wherein the motion of the motion plate is defined by the height of the motion plate bottom support.

16. The MEMS actuator with discretely controlled multiple motions of claim 1, wherein the stepper plate is actuated by electrostatic force induced by the stepper plate electrodes.

17. The MEMS actuator with discretely controlled multiple motions of claim 16, wherein driving voltage of the motion plate is reduced by using multiple stepper plate electrodes to actuate the stepper plate.

18. The MEMS actuator with discretely controlled multiple motions of claim 16, wherein each stepper plate has at least one landing structure, disposed on the bottom layer, configured to stop the rotation of the stepper plate by contacting the actuated stepper plate.

19. The MEMS actuator with discretely controlled multiple motions of claim 1, wherein the motion plate has one rotational degree of freedom motion.

20. The MEMS actuator with discretely controlled multiple motions of claim 1, wherein the motion plate has two rotational degrees of freedom motion.

21. The MEMS actuator with discretely controlled multiple motions of claim 1, wherein the motion plate has one translational degree of freedom motion.

22. The MEMS actuator with discretely controlled multiple motions of claim 1, wherein the motion plate has one rotational degree of freedom motion and one translational degree of freedom motion.

23. The MEMS actuator with discretely controlled multiple motions of claim 1, wherein the motion plate has two rotational degrees of freedom motion and one translational degree of freedom motion.

* * * * *